United States Patent
Koyama et al.

(10) Patent No.: US 8,216,914 B2
(45) Date of Patent: Jul. 10, 2012

(54) METHOD FOR MANUFACTURING SOI SUBSTRATE AND METHOD FOR MANUFACTURING SEMICONDUCTOR DEVICE

(75) Inventors: Masaki Koyama, Atsugi (JP); Kosei Nei, Atsugi (JP); Toru Hasegawa, Atsugi (JP); Junpei Momo, Sagamihara (JP); Eiji Higa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 109 days.

(21) Appl. No.: 12/872,222

(22) Filed: Aug. 31, 2010

(65) Prior Publication Data

US 2011/0053384 A1  Mar. 3, 2011

(30) Foreign Application Priority Data

Sep. 2, 2009  (JP) .................................. 2009-202286

(51) Int. Cl.
   *H01L 21/46* (2006.01)
   *H01L 21/30* (2006.01)
   *H01L 21/84* (2006.01)
   *H01L 21/00* (2006.01)

(52) U.S. Cl. ........ 438/455; 438/459; 438/458; 438/406; 438/164

(58) Field of Classification Search .................. 438/164, 438/406, 455, 458, 459
   See application file for complete search history.

(56) References Cited

U.S. PATENT DOCUMENTS

| | | | |
|---|---|---|---|
| 5,569,610 A * | 10/1996 | Zhang et al. .................. | 438/166 |
| 6,372,609 B1 * | 4/2002 | Aga et al. ...................... | 438/459 |
| 6,706,568 B2 | 3/2004 | Nakajima | |
| 7,119,365 B2 | 10/2006 | Takafuji | |
| 7,253,032 B2 | 8/2007 | Yamazaki et al. | |
| 7,348,222 B2 * | 3/2008 | Shimomura et al. .......... | 438/149 |
| 7,619,250 B2 | 11/2009 | Takafuji et al. | |
| 2008/0286952 A1 | 11/2008 | Miyairi et al. | |
| 2009/0081844 A1 | 3/2009 | Yamazaki | |
| 2009/0098710 A1 | 4/2009 | Yamazaki | |
| 2009/0115029 A1 | 5/2009 | Koyama et al. | |
| 2010/0019242 A1 | 1/2010 | Takafuji et al. | |

FOREIGN PATENT DOCUMENTS

JP  2004-087606  3/2004
JP  2005-252244  9/2005

* cited by examiner

*Primary Examiner* — Luan C Thai
(74) *Attorney, Agent, or Firm* — Eric J. Robinson; Robinson Intellectual Property Law Office, P.C.

(57) ABSTRACT

An object is to provide a method for manufacturing an SOI substrate including a semiconductor film with high planarity and high crystallinity. After a single crystal semiconductor film is formed over an insulating film by a separation step, a natural oxide film existing on a surface of the semiconductor film is removed and the semiconductor film is irradiated with first laser light and second laser light under an inert gas atmosphere or a reduced-pressure atmosphere. The number of shots of the first laser light that is emitted to an arbitrary point in the semiconductor film is greater than or equal to 7, preferably greater than or equal to 10 and less than or equal to 100. The number of shots of the second laser light that is emitted to an arbitrary point in the semiconductor film is greater than 0 and less than or equal to 2.

34 Claims, 19 Drawing Sheets mitted to an arbitrary point is, the more the crystallinity can be improved. However, when the number of shots is large, although the crystallinity can be effectively improved, planarity of the semiconductor film after the laser light irradiation is impaired. Specifically, depending on the scanning interval, a rough region having crater-shaped or granular unevenness is formed on a surface of the semiconductor film so as to be overlapped with a region having a low energy density in an end portion of a beam spot. Generation of this rough region which is called "pitch stripes" noticeably occurs when the number of shots of laser light is large or the energy density of the laser light is high, which causes deterioration in characteristics of a semiconductor element formed using the semiconductor film or deterioration in characteristic uniformity of the semiconductor element.

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to a method for manufacturing a silicon-on-insulator (SOI) substrate and a method for manufacturing a semiconductor device using the method for manufacturing an SOI substrate.

2. Description of the Related Art

Demands for higher integration, higher operation speed, higher performance, and lower power consumption of a semiconductor integrated circuit have been more stringent, and in response to such demands, a transistor using an SOI substrate has attracted attention as an effective means that can take the place of a bulk transistor. Higher operation speed and lower power consumption of a semiconductor device can be expected more in the transistor using the SOI substrate than in the bulk transistor because a semiconductor film is formed over an insulating film in the transistor using the SOI substrate, and accordingly parasitic capacitance can be reduced and generation of leakage current flowing through the substrate can be suppressed. In addition, since the semiconductor film used as an active layer can be formed thin, a short channel effect can be suppressed; thus, an element can be miniaturized and higher integration of a semiconductor integrated circuit can be realized accordingly.

As one method for manufacturing an SOI substrate, a method is given in which a semiconductor film is formed over a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described methods make it possible to form over an inexpensive glass substrate, a high-performance integrated circuit which uses a single crystal semiconductor film.

For example, Patent Document 1 has disclosed a method for manufacturing an SOI substrate by attaching to a glass substrate, a semiconductor film separated from a bulk semiconductor substrate.

In Patent Document 2, a method for improving crystallinity of a semiconductor thin film layer transferred to a glass substrate with use of laser light irradiation is disclosed.

REFERENCE

Patent Document

[Patent Document 1] Japanese Published Patent Application No. 2004-087606
[Patent Document 2] Japanese Published Patent Application No. 2005-252244

SUMMARY OF THE INVENTION

An SOI substrate in which the above glass substrate is used is advantageous in that it can be manufactured with lower cost than an SOI substrate in which a semiconductor substrate is used, and increase in area of a semiconductor device can be easily realized. Since a glass substrate has a lower heat-resistant temperature than a semiconductor substrate, it can be said that laser light irradiation disclosed in Patent Document 2 is suitable for improving crystallinity of a semiconductor film after separation.

In the case where a semiconductor film after separation is irradiated with pulsed laser light for improving crystallinity, the larger the number of shots of laser light that is emitted to an arbitrary point is, the more the crystallinity can be improved. However, when the number of shots is large, although the crystallinity can be effectively improved, planarity of the semiconductor film after the laser light irradiation is impaired. Specifically, depending on the scanning interval, a rough region having crater-shaped or granular unevenness is formed on a surface of the semiconductor film so as to be overlapped with a region having a low energy density in an end portion of a beam spot. Generation of this rough region which is called "pitch stripes" noticeably occurs when the number of shots of laser light is large or the energy density of the laser light is high, which causes deterioration in characteristics of a semiconductor element formed using the semiconductor film or deterioration in characteristic uniformity of the semiconductor element.

On the other hand, when the number of shots of laser light is small, a semiconductor film whose planarity is high can be obtained after the laser light irradiation. However, in this case, crystallinity of the semiconductor film is less improved as compared with that in the case where the number of shots is large.

In view of the above problems, an object of the present invention is to provide a method for manufacturing an SOI substrate which includes a semiconductor film with high planarity and high crystallinity. Another object of the present invention is to provide a method for manufacturing a semiconductor device whose variation in characteristics is reduced and which includes a semiconductor element with favorable characteristics.

The present inventors examined the conditions where the above pitch stripes are generated, and have found that the generation of the pitch stripes results from a natural oxide film of several nanometers thick existing on a surface of a semiconductor film. Thus, laser light irradiation was performed under an atmosphere in which oxygen was removed as much as possible such as a nitrogen atmosphere or a reduced-pressure atmosphere. As a result, generation of pitch stripes was suppressed not sufficiently but somewhat. The probable reason of this is as follows: when the number of shots is made large for sufficiently improving crystallinity, oxygen which is slightly present in an atmosphere and a semiconductor react with each other; then, an oxide film is formed on the surface of the semiconductor film; and in such a manner, pitch stripes are generated.

According to the experiment, in the case where a single crystal semiconductor film is irradiated with laser light, when the number of shots is increased in the state where a natural oxide film is formed on a surface of the semiconductor film, cracks are generated in the semiconductor film depending on the energy density of the laser light. In addition, it is found that in the case of a single crystal semiconductor film, the larger the thickness of a natural oxide film is, the wider the range of the energy density in which the above cracks are generated becomes. The present inventors have not confirmed generation of the above cracks in the case of crystallization of an amorphous semiconductor film, a microcrystalline semiconductor film, or a polycrystalline semiconductor film with use of laser light; therefore, the present inventors have thought that in the case of a single crystal semiconductor film, crystallization proceeds by a mechanism which is different from that in the case of the above semiconductor film. Therefore, it is not suitable to simply apply a method for crystallizing an amorphous semiconductor film, a microcrystalline semiconductor film, or a polycrystalline semiconductor film with use of laser light to improvement in crystallinity of a single crystal semiconductor film.

In order to solve the above problems, the present inventors have found a method for manufacturing an SOI substrate described below. A semiconductor film is formed over an insulating film after separation, and then, a natural oxide film existing on a surface of the semiconductor film is removed. Then, the semiconductor film is irradiated with first laser light. Irradiation with the first laser light is performed under a rare gas atmosphere, a nitrogen atmosphere, or a reduced-pressure atmosphere so that the number of shots of the first laser light that is emitted to an arbitrary point in the semiconductor film is greater than or equal to 7, preferably greater than or equal to 10 and less than or equal to 100. After the semiconductor film is irradiated with the first laser light, the semiconductor film is irradiated with second laser light. Irradiation with the second laser light is performed under a rare gas atmosphere, a nitrogen atmosphere, or a reduced-pressure atmosphere so that the number of shots of the second laser light that is emitted to an arbitrary point in the semiconductor film is greater than 0 and less than or equal to 2.

The energy density of the first laser light and the second laser light is set to such an energy density that microcrystals are not easily generated. Through the first laser light irradiation, defects in the semiconductor film whose crystallinity is impaired due to the separation step can be repaired. In addition, through the first laser light irradiation, roughness on the surface of the semiconductor film which is caused due to the separation step can be suppressed to some extent. However, pitch stripes due to the first laser light irradiation are generated on the surface of the semiconductor film; therefore, scanning with the second laser light is performed so that a beam spot overlaps with the pitch stripes due to the first laser light irradiation.

Note that it is rarely that the energy of the laser light is perfectly uniform in a beam spot; in general, the energy of laser light is changed depending on positions in the beam spot. In this specification, when the highest energy value of laser light is assumed to be 100%, the range of a beam spot which is irradiated with one shot of the laser light corresponds to a region which is irradiated with the laser light having an energy value of 80% or higher with respect to the highest energy value.

Note that a natural oxide film existing on the surface of the semiconductor film may be removed again before the semiconductor film is irradiated with the second laser light.

After the above SOI substrate is formed, the thin semiconductor film is processed into a desired shape by etching or the like, whereby an island-shaped semiconductor film is formed. A variety of semiconductor elements such as a thin film transistor, a diode, a resistor, and a capacitor are formed with use of this island-shaped semiconductor film, whereby a semiconductor device can be manufactured.

With the above structure, an SOI substrate including a semiconductor film with high planarity and high crystallinity can be provided. In addition, a method for manufacturing a semiconductor device whose variation in characteristics is reduced and which includes a semiconductor element with favorable characteristics can be provided.

DETAILED DESCRIPTION OF THE INVENTION

Embodiments of the present invention will be hereinafter described in detail with reference to the accompanying drawings. Note that the present invention is not limited to the description below, and those skilled in the art will appreciate that a variety of modifications can be made to the modes and details without departing from the spirit and scope of the present invention. Therefore, the present invention is not construed as being limited to description of the embodiments below.

The present invention can be applied to manufacture of any kind of semiconductor devices including microprocessors, integrated circuits such as image processing circuits, RF tags, and semiconductor display devices. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

Embodiment 1

In this embodiment, methods for manufacturing an SOI substrate and a semiconductor device according to one embodiment of the present invention will be described.

Figure 1A:
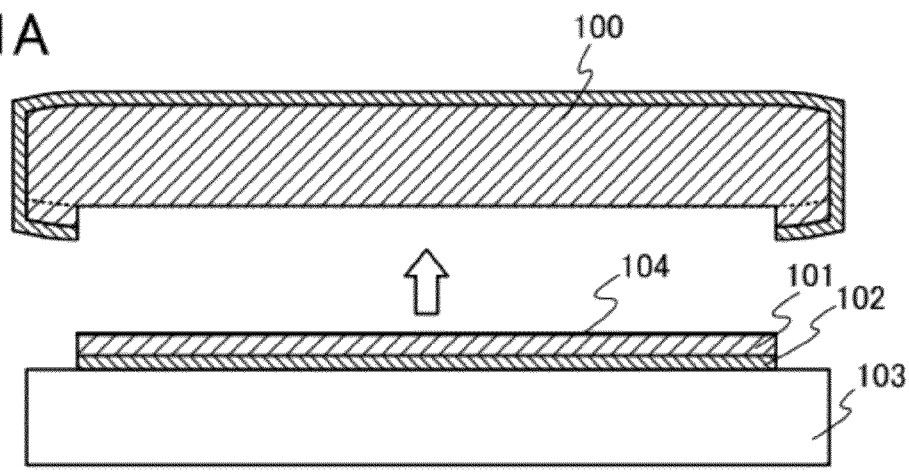
FIGS. 1A to 1C are diagrams illustrating a manufacturing method according to one embodiment of the present invention.

First, as illustrated in FIG. 1A, a thin semiconductor film 101 obtained by being separated from a bond substrate 100 is formed over a base substrate 103 with an insulating film 102 sandwiched therebetween.

As the bond substrate 100, a single crystal semiconductor substrate formed using silicon, germanium, or the like can be used. Alternatively, a single crystal semiconductor substrate formed using a compound semiconductor such as gallium arsenide or indium phosphide can be used as the bond substrate 100. Further alternatively, a semiconductor substrate formed using silicon having crystal lattice distortion, silicon germanium in which germanium is added to silicon, or the like may be used as the bond substrate 100.

Note that in a single crystal semiconductor substrate used for the bond substrate 100, the directions of crystal axes are preferably uniform; however, the substrate is not necessarily formed using perfect crystals in which a lattice defect such as a point defect, a line defect, or a plane defect is completely eliminated.

A variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 103. As the base substrate 103, alternatively, a semiconductor substrate formed using silicon, gallium arsenide, indium phosphide, or the like can be used. Further alternatively, a metal substrate including a stainless steel substrate may be used as the base substrate 103.

As the glass substrate, a mother glass substrate developed for production of liquid crystal panels can be used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. When an SOI substrate is manufactured using a large-sized mother glass for the base substrate 103, the SOI substrate can have a large area. By the use of a large-area substrate like a mother glass substrate as the base substrate 103, an SOI substrate can have a larger area. When the SOI substrate can have a larger area, a large number of chips such as ICs or LSIs can be manufactured at one time and the number of chips manufactured from one substrate increases. As a result, the productivity can be improved drastically.

Moreover, an insulating film may be formed in advance over the base substrate 103. The base substrate 103 is not necessarily provided with an insulating film on its surface. However, the formation of the insulating film on the surface of the base substrate 103 can prevent impurities of the base substrate 103, such as an alkali metal and an alkaline earth metal, from entering the bond substrate 100. Moreover, in the case of forming the insulating film on the surface of the base substrate 103, the insulating film over the base substrate 103 is bonded to the insulating film 102; therefore, a wider variety of substrates can be used as the base substrate 103. In general, the upper temperature limits of substrates formed of flexible synthetic resins such as plastics tend to be low. However, as long as the substrates can resist process temperatures in later steps of manufacturing semiconductor elements, the substrates formed of such resins can be used as the base substrate 103 in the case of forming the insulating film over the base substrate 103. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

Crystal defects are formed in the semiconductor film 101 obtained by being separated from the bond substrate 100, or planarity of a surface of the semiconductor film 101 is impaired. Thus, in one embodiment of the present invention, in order to reduce crystal defects and improve planarity, the semiconductor film 101 is irradiated with first laser light after a process of removing an oxide film 104 such as a natural oxide film which is formed on the surface of the semiconductor film 101.

The process of removing the oxide film 104 can be performed by immersing the semiconductor film 101 in hydrofluoric acid. It is desirable that the process be performed with hydrofluoric acid until the surface of the semiconductor film 101 has a water-repellent property. Having a water-repellent property indicates the removal of the oxide film 104 from the semiconductor film 101. In the case where removal of an oxide film is performed with a wet method using hydrofluoric acid, dilute hydrogen fluoride (DHF) which is a hydrogen fluoride aqueous solution, buffered hydrogen fluoride (BHF) in which hydrogen fluoride and ammonium fluoride are mixed, hydrogen fluoride hydrogen peroxide deionized water mixture (FPM) in which hydrogen fluoride and hydrogen peroxide water are mixed, or the like can be used.

Figure 1B:
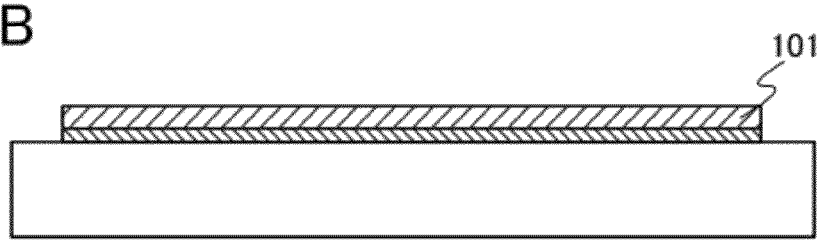

In this embodiment, for example, the semiconductor film 101 is immersed in DHF having a hydrogen fluoride concentration of 0.5 wt % for 110 seconds, whereby the oxide film 104 on the surface of the semiconductor film 101 is removed as illustrated in FIG. 1B. One example of the process of removing the oxide film 104 with use of a spin washing machine is described below.

First, the base substrate 103 over which the semiconductor film 101 is formed is fixed to a rotation table. The base substrate 103 is subjected to megasonic cleaning using pure water while the rotation table is rotated, whereby dust on the semiconductor film 101 or the oxide film 104 is removed. The megasonic cleaning is performed in such a manner that a high frequency wave of approximately 1 MHz is applied to a rotation table, and pure water is discharged onto the base substrate 103 from a nozzle for 30 seconds in the state where the rotation table is rotated at a spinning rate of 200 rpm. Next, the spinning speed of the rotation table is kept at 200 rpm, and DHF having a hydrogen fluoride concentration of 0.5 wt % is discharged onto the base substrate 103 from the nozzle for 110 seconds, whereby the oxide film 104 over the semiconductor film 101 is removed. Note that in order to prevent DHF from entering and passing through a side opposite to a surface of the base substrate 103 on which the semiconductor film 101 is formed (i.e., a rear surface side of the base substrate 103), the rear surface side of the base substrate 103 is cleaned by rinse with pure water in the state where DHF is discharged onto the base substrate 103. Then, also after discharge of DHF is completed, the rear surface side of the base substrate 103 is cleaned by rinse with pure water for further 5 seconds in the state where the spinning rate of the rotation table is kept at 200 rpm. Next, the spinning rate of the rotation table is kept at 200 rpm, and the base substrate 103 is subjected to megasonic cleaning using pure water, whereby DHF attached to the base substrate 103 is removed. The megasonic cleaning is performed in such a manner that a high frequency wave of approximately 1 MHz is applied to the rotation table, and pure water is discharged onto the base substrate 103 from the nozzle for 110 seconds. This megasonic cleaning for removing DHF is also performed by cleaning the rear surface side of the base substrate 103 by rinse with pure water, in order to prevent DHF from entering and passing through the rear surface side of the base substrate 103. Next, the base substrate 103 is dried. The rotation table is rotated in the state where nitrogen is blown on a center portion of the base substrate 103, whereby the base substrate 103 is dried. The spinning rate of the rotation table is kept as low as 10 rpm for first 5 seconds, and then, the spinning rate of the rotation table is kept as high as 2000 rpm for 90 seconds. In such a manner, the spinning rate is kept low first, whereby a spot called a "watermark" which is generated due to melting of a semiconductor into pure water or oxidation of silicon at a boundary of a water droplet can be prevented from being generated on the surface of the semiconductor film 101.

Note that pure water used for cleaning the base substrate 103 preferably contains carbon dioxide for preventing electrostatic charge. Since a natural oxide film is easily formed on a surface of a semiconductor film in an atmosphere in which oxygen and moisture present, pure water in which an oxygen concentration is reduced is used; thus, a natural oxide film can be prevented from being formed on the surface of the semiconductor film 101 in cleaning.

In this embodiment, an example in which DHF is used is described. Note that in the case where removal of an oxide film is performed with use of FPM, the amount of contamination caused by a metal such as copper can be made lower than that in the case where removal of an oxide film is performed with use of DHF by about two digits.

As a method for removing a natural oxide film, the above wet method can be used; however, a dry method can alternatively be used. In the case where a dry method is used, a watermark can be prevented from being generated on a surface of a semiconductor film after a chemical solution is cleaned up with pure water, unlike in the case where a wet method is used. When a natural oxide film is removed by a dry method, a method in which dry etching is performed by making argon into plasma, a method in which nitrogen trifluoride and a rare gas such as helium or hydrogen are made into plasma so that a reaction of an oxide film and fluorine is promoted and they are vaporized, a method in which a natural oxide film is exposed to hydrofluoric acid vapor, or the like can be used.

Note that after the oxide film 104 is removed and before the first laser light irradiation is performed, the semiconductor film 101 is preferably kept under an inert gas atmosphere or a reduced-pressure atmosphere. A natural oxide film is easily formed on a surface of a semiconductor film in an atmosphere where oxygen and moisture present; therefore, the semiconductor film 101 is preferably kept in an atmosphere where the absolute humidity is low. When the semiconductor film 101 is exposed to an air atmosphere after the oxide film 104 is removed, a natural oxide film is formed on the surface of the semiconductor film 101 as time passes. The larger the thickness of this natural oxide film is, the more cracks are formed in the semiconductor film 101 by the first laser light irradiation later; therefore, a process of removing the oxide film described above is desirably performed again on the semiconductor film 101 which has been kept under an air atmosphere for 30 minutes or more after the oxide film 104 is removed.

Figure 1C:
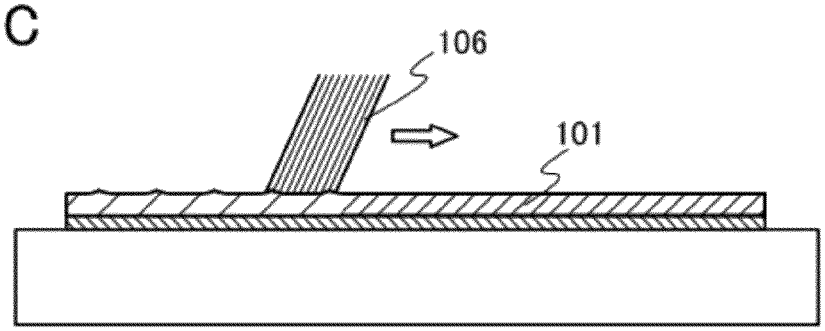
Figure 2A:
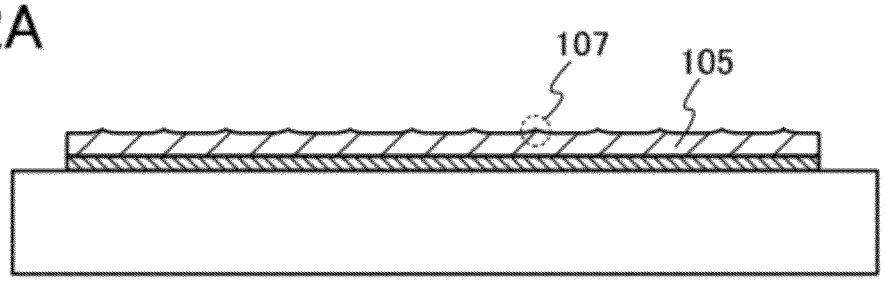
FIGS. 2A to 2C are diagrams illustrating a manufacturing method according to one embodiment of the present invention.

Next, as illustrated in FIG. 1C, the semiconductor film 101 is irradiated with the first laser light. In one embodiment of the present invention, the first laser light irradiation is performed mainly for repairing crystal defects in the semiconductor film 101. As illustrated in FIG. 1C, scanning is performed with laser light 106 in a direction indicated by an arrow, whereby the crystal defects in the semiconductor film 101 are repaired. Then, through the first laser light irradiation, a semiconductor film 105 whose crystal defects have been repaired is formed as illustrated in FIG. 2A.

The first laser light irradiation is preferably performed with such an energy density that the semiconductor film 101 is partially melted. This is because if the semiconductor film 101 is completely melted, generation of microcrystals due to recrystallization of the semiconductor film 101 is accompanied with disordered nucleation of the semiconductor film 101 in a liquid phase and crystallinity of the semiconductor film 101 is lowered. By partial melting, so-called vertical growth in which crystal growth proceeds from an unmelted solid portion occurs in the semiconductor film 101. Due to the recrystallization by the vertical growth, crystal defects of the semiconductor film 101 are reduced and crystallinity thereof is recovered. The state in which the semiconductor film 101 is completely melted indicates the state in which the semiconductor film 101 is melted to be in a liquid phase to the interface with the insulating film 102. On the other hand, the state in which the semiconductor film 101 is partially melted indicates that an upper part thereof is melted and is in a liquid phase and a lower part thereof is in a solid phase.

As this first laser light irradiation, pulsed laser light irradiation is preferable for partially melting the semiconductor film 101. For example, in the case of a pulsed laser, the repetition rate is less than or equal to 1 MHz and the pulse width is greater than or equal to 10 nanoseconds and less than or equal to 500 nanoseconds. As a laser, for example, a XeCl excimer laser having a repetition rate of 10 Hz to 300 Hz, a pulse width of 25 nanoseconds, and a wavelength of 308 nm can be used.

The number of shots of the first laser light that is emitted to an arbitrary point in the semiconductor film 101 is set to greater than or equal to 7, preferably, greater than or equal to 10 and less than or equal to 100. The number of shots of the first laser light is set larger than that of second laser light which is to be emitted later, whereby the crystal defects in the semiconductor film 101 can be repaired and crystallinity of the semiconductor film 105 after the laser light irradiation can be favorable.

As the laser light used for the first laser light irradiation, a fundamental wave or a second harmonic of a solid-state laser, which is selectively absorbed by a semiconductor, is preferably used. Specifically, for example, laser light having a wavelength in the range of greater than or equal to 250 nm and less than or equal to 700 nm can be used. The energy of the laser light can be determined in consideration of the wavelength of the laser light, the skin depth of the laser light, the thickness of the semiconductor film 101, or the like. For example, in the case where the thickness of the semiconductor film 101 is about 120 nm and a pulsed laser that emits laser light having a wavelength of 308 nm is used, the energy density of the first laser light may be set to 600 mJ/cm$^2$ to 700 mJ/cm$^2$.

It is rarely that the energy of laser light is perfectly uniform in a beam spot; in general, the energy of laser light is changed depending on positions in the beam spot. Note that the boundary of the beam spot is not clear, and is infinite in theory. In this embodiment, the energy distribution of the laser light is measured with use of a beam profiler. When the highest energy value of the laser light is assumed to be 100%, a region which is irradiated with laser light having an energy value of about 80% or higher with respect to the highest energy value is in the range of the beam spot which is irradiated with one shot of the laser light.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

The first laser irradiation is preferably performed in an inert atmosphere such as a rare gas atmosphere or a nitrogen atmosphere, or a reduced-pressure atmosphere. In the case of the above atmosphere, the laser light irradiation may be performed in an airtight chamber whose atmosphere is controlled. If the chamber is not used, the laser light irradiation in an inert atmosphere can be achieved by spraying an inert gas such as a nitrogen gas to the surface to be irradiated with the laser light. The first laser light irradiation is performed in an inert atmosphere or a reduced-pressure atmosphere instead of an air atmosphere, whereby the natural oxide film is further prevented from being formed, cracks or pitch stripes can be prevented from being formed in the semiconductor film 105 which is formed after the laser light irradiation, planarity of the semiconductor film 105 can be improved, and the applicable energy range for the laser light can be widened.

The laser light preferably has its cross section shaped into a linear form with homogenous energy distribution through an optical system. Accordingly, the laser light irradiation can be performed homogenously with high throughput. With the beam length of the laser light longer than one side of the base substrate 103, the entire semiconductor film 101 attached to the base substrate 103 can be irradiated with the laser light by performing scanning once. When the beam length of the laser light is shorter than one side of the base substrate 103, the beam length may be set so that the entire semiconductor film 101 attached to the base substrate 103 can be irradiated with the laser light by performing scanning several times.

For example, in this embodiment, in the case where the thickness of the semiconductor film 101 is about 140 nm, the first laser light irradiation can be performed in the following manner. As a laser emitting laser light, a XeCl excimer laser (wavelength: 308 nm, pulse width: 20 nanoseconds, and repetition rate: 30 Hz) is used. The cross section of the laser light is shaped into a linear form with a size of 0.4 mm×120 mm through an optical system. The laser scanning speed is 0.5 mm/s, and the beam shot number is about 24; in this manner, the semiconductor film 101 is irradiated with the laser light.

In the case where the surface of the semiconductor film 101 is planarized by dry etching before the first laser light irradiation, damages such as crystal defects might occur on and near the surface of the semiconductor film 101 due to the dry etching. However, the aforementioned laser light irradiation can repair even the damages caused by the dry etching.

Note that as described above, the first laser light irradiation is performed in an inert atmosphere or a reduced-pressure atmosphere instead of an air atmosphere, whereby the natural oxide film can be further prevented from being formed on the surface of the semiconductor film 105. Since the first laser light irradiation is performed mainly for repairing crystallinity, the number of shots of the first laser light is made larger than that of second laser light which is to be emitted later. Therefore, a small amount of oxygen in the atmosphere and a semiconductor are easily reacted with each other and the natural oxide film is easily formed in the first laser light irradiation as compared with those in the second laser light irradiation. Therefore, there is a possibility that pitch stripes 107 which correspond to a rough region having crater-shaped or granular unevenness are generated on the surface of the semiconductor film 105 due to the natural oxide film, depending on the scanning interval.

Figure 2B:
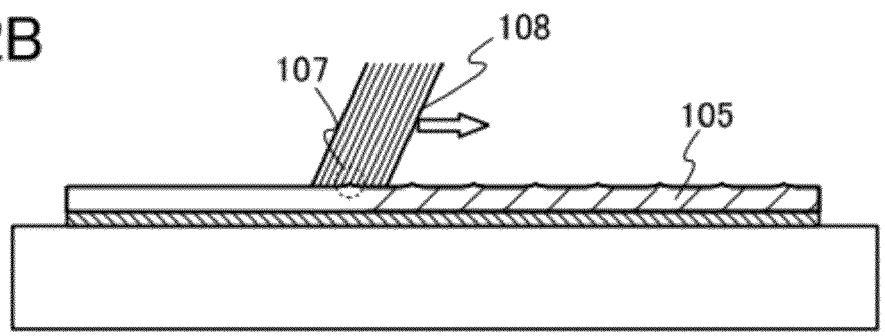
Figure 2C:
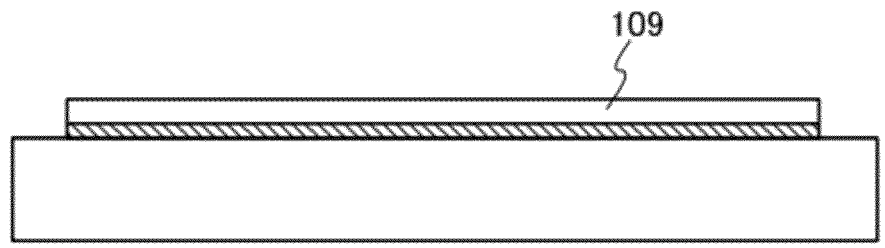

Although surface roughness of the semiconductor film which is caused by separation is repaired to some extent by the first laser light irradiation, the semiconductor film 105 is irradiated with the second laser light in one embodiment of the present invention as illustrated in FIG. 2B, in order to further improve the planarity of the semiconductor film 105, specifically, to reduce a difference in height due to the pitch stripes 107 formed on the surface of the semiconductor film 105, or to reduce the number of pitch stripes. As illustrated in FIG. 2B, scanning is performed with laser light 108 in a direction indicated by an arrow, whereby the planarity of the semiconductor film 105 is improved. Then, through the second laser light irradiation, a semiconductor film 109 whose planarity is high is formed as illustrated in FIG. 2C.

The second laser light irradiation is preferably performed with such an energy density that the semiconductor film 105 is partially melted. This is because if the semiconductor film 101 is completely melted, generation of microcrystals due to recrystallization of the semiconductor film 105 is accompanied with disordered nucleation of the semiconductor film 105 in a liquid phase and crystallinity of the semiconductor film 105 is lowered. By partial melting, so-called vertical growth in which crystal growth proceeds from an unmelted solid portion occurs in the semiconductor film 105. Due to the recrystallization by the vertical growth, crystal defects of the semiconductor film 105 are reduced and crystallinity thereof is recovered. The state in which the semiconductor film 105 is completely melted indicates the state in which the semiconductor film 105 is melted to be in a liquid phase to the interface with the insulating film 102. On the other hand, the state in which the semiconductor film 105 is partially melted indicates that an upper part thereof is melted and is in a liquid phase and a lower part thereof is in a solid phase.

Note that such energy densities that the semiconductor films are partially melted differ depending on the thicknesses of the semiconductor films. In addition, even if the average thicknesses of semiconductor films are the same, such energy densities that the semiconductor films are partially melted differ depending on surface roughness. For example, variation in the thickness of the semiconductor film is caused due to the surface roughness of the semiconductor film which is generated due to the separation step. This variation in the thickness of the semiconductor film due to the surface roughness is larger than variation in the thickness of a portion with the pitch strips. Thus, the variation in the thickness of the semiconductor film 105 before the second laser light irradiation is larger than the variation in the thickness of the semiconductor film 101 before the first laser light irradiation; it is expected that the minimum thickness of the semiconductor film 105 is larger than the minimum thickness of the semiconductor film 101. Therefore, although the average thickness of the semiconductor film 101 and that of the semiconductor film 105 are substantially the same, the energy density of the second laser light can be set larger than that of the first laser light, and the applicable energy density range of the second laser light is wider than that of the first laser light.

As this second laser light irradiation, pulsed laser light irradiation is preferable for partially melting the semiconductor film 105. For example, in the case of a pulsed laser, the repetition rate is less than or equal to 1 MHz and the pulse width is greater than or equal to 10 nanoseconds and less than or equal to 500 nanoseconds. As a laser, for example, a XeCl excimer laser having a repetition rate of 10 Hz to 300 Hz, a pulse width of 25 nanoseconds, and a wavelength of 308 nm can be used.

The second laser light irradiation may be performed on at least a region where pitch stripes are formed, and the number of shots does not have to be large. If the number of shots is increased, cracks may be formed in the semiconductor film 109 due to a natural oxide film which might be formed on the surface of the semiconductor film 105 through the first laser light irradiation. Therefore, the number of shots of the second laser light is made smaller than that of the first laser light. Specifically, the number of shots of the second laser light that is emitted to an arbitrary point in the semiconductor film 105 is set to greater than 0 and less than or equal to 2.

As the laser light used for the second laser light irradiation, a fundamental wave or a second harmonic of a solid-state laser, which is selectively absorbed by a semiconductor, is preferably used. Specifically, for example, laser light having a wavelength in the range of greater than or equal to 250 nm and less than or equal to 700 nm can be used. The energy of the laser light can be determined in consideration of the wavelength of the laser light, the skin depth of the laser light, the thickness of the semiconductor film 105, or the like. For example, in the case where the thickness of the semiconductor film 105 is about 120 nm and a pulsed laser that emits laser light having a wavelength of 308 nm is used, the energy density of the second laser light may be set to 600 mJ/cm$^2$ to 700 mJ/cm$^2$.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

The second laser irradiation is preferably performed in an inert atmosphere such as a rare gas atmosphere or a nitrogen atmosphere, or a reduced-pressure atmosphere. In the case of the above atmosphere, the laser light irradiation may be performed in an airtight chamber whose atmosphere is controlled. If the chamber is not used, the laser light irradiation in an inert atmosphere can be achieved by spraying an inert gas such as a nitrogen gas to the surface to be irradiated with the laser light. The second laser light irradiation is performed in an inert atmosphere or a reduced-pressure atmosphere instead of an air atmosphere, whereby the natural oxide film is further prevented from being formed, cracks or pitch stripes can be prevented from being formed in the semiconductor film 109 which is formed after the laser light irradiation, planarity of the semiconductor film 109 can be improved, and the applicable energy range for the laser light can be widened.

The laser light preferably has its cross section shaped into a linear form with homogenous energy distribution through an optical system. Accordingly, the laser light irradiation can be performed homogenously with high throughput. With the beam length of the laser light longer than one side of the base substrate 103, the entire semiconductor film 105 attached to the base substrate 103 can be irradiated with the laser light by scanning once. When the beam length of the laser light is shorter than one side of the base substrate 103, the beam length may be set so that the entire semiconductor film 105 attached to the base substrate 103 can be irradiated with the laser light by scanning several times.

For example, in this embodiment, in the case where the thickness of the semiconductor film 105 is about 140 nm, the second laser light irradiation can be specifically performed in the following manner. As a laser emitting laser light, a XeCl excimer laser (wavelength: 308 nm, pulse width: 20 nanoseconds, and repetition rate: 30 Hz) is used. The cross section of the laser light is shaped into a linear form with a size of 0.4 mm×120 mm through an optical system. The laser scanning speed is 8.0 mm/s, and the beam shot number is about 1.5; in this manner, the semiconductor film 105 is irradiated with the laser light.

The number of shots of the second laser light is smaller than that of the first laser light because the second laser light irradiation is performed mainly for planarizing the surface of the semiconductor film. Therefore, cracks due to a natural oxide film are less likely to be formed in the semiconductor film. However, in the case where higher planarity is preferred, a natural oxide film which might be formed on the surface of the semiconductor film 105 may be removed before the second laser light irradiation. The process of removing the oxide film 104 described above can be referred to for removal of the natural oxide film.

After the laser irradiation, the semiconductor film 109 is preferably subjected to heat treatment at greater than or equal to 500° C. and less than or equal to 650° C. This heat treatment can repair defects of the semiconductor film 109 which have not been repaired in the first laser light irradiation or the second laser light irradiation and can reduce distortion of the semiconductor film 109. For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. For example, in the case of using a resistance heating furnace, heat treatment is performed at 500° C. for an hour and then another heat treatment is performed at 550° C. for four hours.

Through the above steps, an SOI substrate according to one embodiment of the present invention can be manufactured. Further, a variety of semiconductor elements are manufactured with use of the semiconductor film 109, whereby a semiconductor device can be manufactured. According to one embodiment of the present invention, an SOI substrate including a semiconductor film with high planarity and high crystallinity can be provided without using a laser light irradiation apparatus that can control an atmosphere at high level. In addition, a method for manufacturing a semiconductor device whose variation in characteristics is reduced and which includes a semiconductor element with favorable characteristics can be provided without using a laser light irradiation apparatus that can control an atmosphere at high level.

Embodiment 2

In this embodiment, methods for manufacturing an SOI substrate and a semiconductor device according to one embodiment of the present invention will be specifically described in detail.

Figure 3A:
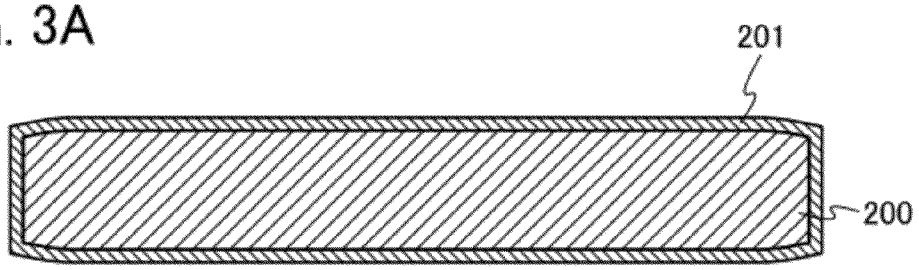
FIGS. 3A to 3D are diagrams illustrating a manufacturing method according to one embodiment of the present invention.

As illustrated in FIG. 3A, a bond substrate 200 is cleaned, and then, an insulating film 201 is formed over the bond substrate 200.

As the bond substrate 200, a single crystal semiconductor substrate formed using silicon, germanium, or the like can be used. Alternatively, a single crystal semiconductor substrate formed using a compound semiconductor such as gallium arsenide or indium phosphide can be used as the bond substrate 200. Further alternatively, a semiconductor substrate formed using silicon having crystal lattice distortion, silicon germanium in which germanium is added to silicon, or the like may be used as the bond substrate 200.

Note that in a single crystal semiconductor substrate used for the bond substrate 200, the directions of crystal axes are preferably uniform; however, the substrate is not necessarily formed using perfect crystals in which a lattice defect such as a point defect, a line defect, or a plane defect is completely eliminated.

In addition, the shape of the bond substrate 200 is not limited to a circle, and the substrate can be processed into a shape other than a circle. For example, in consideration of the facts that the shape of a base substrate 203 to which the bond substrate 200 is attached later is generally a rectangle and a light exposure region of a light exposure apparatus such as a reduced projection exposure apparatus is rectangular, and the like, the bond substrate 200 may be processed into a rectangular shape. The bond substrate 200 can be processed by cutting a circular single crystal semiconductor substrate available in the market.

The insulating film 201 may be either a single insulating film or stacked layers of a plurality of insulating films. Considering that a region which includes impurities will be removed later, it is preferable to form the insulating film 201 to a thickness of greater than or equal to 15 nm and less than or equal to 500 nm.

As a film included in the insulating film 201, an insulating film including silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride; or an insulating film including a metal nitride oxide such as an aluminum nitride oxide can also be used.

For example, in this embodiment, an example in which silicon oxide formed by thermal oxidation of the bond substrate 200 is used as the insulating film 201 is described. Note that in FIG. 3A, the insulating film 201 is formed so as to cover the entire surface of the bond substrate 200; however, the insulating film 201 may be formed on at least one surface of the bond substrate 200.

Note that in this specification, an oxynitride is a substance that contains more oxygen than nitrogen, and a nitride oxide is a substance that contains more nitrogen than oxygen. For example, silicon oxynitride is a substance that contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Furthermore, silicon nitride oxide is a substance that contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that the above-described ranges are obtained by measurement using Rutherford backscattering spectrometry (RBS) or hydrogen forward scattering (HFS). In addition, the total of the percentages of the constituent elements does not exceed 100 atomic %.

In the case where the insulating film 201 is formed by thermal oxidation of the surface of the bond substrate 200, dry oxidation in which oxygen having a small amount of moisture is used, thermal oxidation in which gas including a halogen such as hydrogen chloride is added to an oxygen atmosphere, or the like can be used as the thermal oxidation. In addition, wet oxidation such as pyrogenic oxidation in which hydrogen is burnt with oxygen to generate water or water vapor oxidation in which high-purity water is heated at 100° C. or higher to generate water vapor and oxidation is performed with use of the water vapor may be used for forming the insulating film 201.

In the case where the base substrate 203 includes an impurity which decreases the reliability of a semiconductor device, such as an alkali metal or an alkaline earth metal, the insulating film 201 preferably includes at least one layer of a barrier film that can prevent such an impurity from diffusing from the base substrate 203 into a semiconductor film which is to be formed after separation. As the insulating film that can be used as the barrier film, a silicon nitride film, a silicon nitride oxide film, an aluminum nitride film, an aluminum nitride oxide film, or the like can be given. The insulating film that is used as the barrier film is preferably formed to have a thickness of 15 nm to 300 nm, for example. Such a barrier film has a high blocking effect for preventing impurity diffusion; however, the internal stress is high. Therefore, as the lower layer of the insulating film which is in contact with the bond substrate 200, a film with an effect of relieving the stress of the upper layer of the insulating film is preferable. As the insulating film with the effect of relieving the stress of the upper layer of the insulating film, a silicon oxide film, a thermally oxidized film formed by thermally oxidizing the bond substrate 200, or the like is given. The thickness of the lower insulating film can be greater than or equal to 5 nm and less than or equal to 200 nm.

In the case of using silicon oxide as the insulating film 201, the insulating film 201 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 201 may be densified by oxygen plasma treatment. In the case of using silicon nitride as the insulating film 201, the insulating film 201 can be formed by a vapor deposition method such as a plasma CVD method using a mixed gas of silane and ammonia. In the case of using silicon nitride oxide as the insulating film 201, the insulating film 201 can be formed by a vapor deposition method such as a plasma CVD method using a mixed gas of silane and ammonia or a mixed gas of silane and nitrogen oxide.

Furthermore, the insulating film 201 may be made of silicon oxide that is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

By the use of an organosilane gas for the source gas, a silicon oxide film with a flat surface can be formed at a process temperature of 350° C. or lower. Alternatively, low temperature oxide (LTO) formed at a temperature of greater than or equal to 200° C. and less than or equal to 500° C. by a thermal CVD method can be used. For formation of the LTO, monosilane ($SiH_4$), disilane ($Si_2H_6$), or the like can be used as a silicon source gas, and dinitrogen monoxide ($N_2O$) or the like can be used as an oxygen source gas.

For example, in the case of using TEOS and $O_2$ for the source gas to form the silicon oxide film as the insulating film 201, the condition may be set as follows: the flow rate of TEOS is 15 sccm, the flow rate of $O_2$ is 750 sccm, the film forming pressure is 100 Pa, the film forming temperature is 300° C., the RF output is 300 W, and the power source frequency is 13.56 MHz.

Note that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the insulating film at a low temperature. A siloxane bond, which is a covalent bond, is formed finally between the base substrate and the insulating film. The insulating film such as the aforementioned silicon oxide film formed using organosilane or the LTO formed at a relatively low temperature is suitable for bonding at a low temperature, as compared with a thermally oxidized film having no OH bonds or having very few OH bonds which is used in Smart Cut (registered trademark) or the like.

The insulating film 201 forms a bonding plane which is flat and hydrophilic on the surface of the bond substrate 200. Therefore, the average surface roughness $R_a$ of the insulating film 201 is preferably less than or equal to 0.7 nm, more preferably less than or equal to 0.4 nm. In addition, the thickness of the insulating film 201 can be made greater than or equal to 10 nm and less than or equal to 200 nm. The thickness of the insulating film 201 is preferably greater than or equal to 5 nm and less than or equal to 500 nm, more preferably greater than or equal to 10 nm and less than or equal to 200 nm.

Figure 3B:
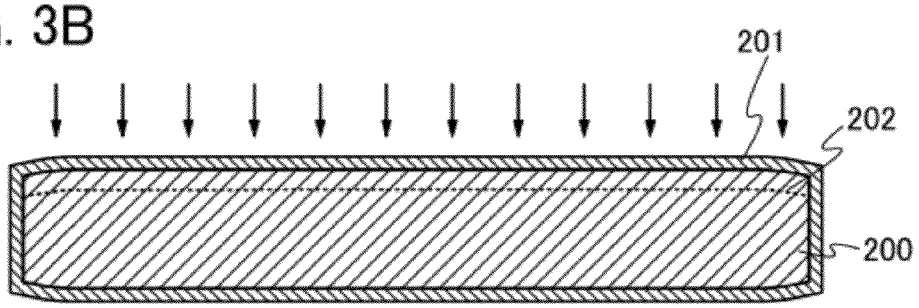

Next, as illustrated in FIG. 3B, the bond substrate 200 is irradiated with an ion beam including ions accelerated by an electric field through the insulating film 201 as indicated by arrows, whereby an embrittlement layer 202 having microvoids is formed in a region at a predetermined depth from the surface of the bond substrate 200. For example, the embrittlement layer means a layer which is locally embrittled by disorder of a crystal structure, and the state of the embrittlement layer depends on a means for forming the embrittlement layer. Note that there may be a case where a region ranging from one surface of the bond substrate to the embrittlement layer is embrittled to some extent; however, the embrittlement layer in this specification refers to a region at which separation is performed later and its vicinity.

The depth at which the embrittlement layer 202 is formed can be adjusted by the acceleration energy of the ion beam and the incident angle thereof. The acceleration energy can be adjusted by acceleration voltage or the like. The embrittlement layer 202 is formed at the same depth or substantially the same depth as the average penetration depth of the ions. The thickness of a semiconductor film 204 which will be separated from the bond substrate 200 is determined based on the depth at which the ions are implanted. The depth at which the embrittlement layer 202 is formed can be set in the range of, for example, greater than or equal to 50 nm and less than or equal to 500 nm, preferably greater than or equal to 50 nm and less than or equal to 200 nm from the surface of the bond substrate 200.

The ions are implanted to the bond substrate 200 desirably by an ion doping method in which mass separation is not performed because the cycle time can be shortened; however, the present invention may employ an ion implantation method in which mass separation is performed.

When hydrogen ($H_2$) is used for a source gas, $H^+$, $H_2^+$, and $H_3^+$ can be produced by exciting a hydrogen gas. Proportions of ion species produced from the source gas can be changed by controlling a plasma excitation method, the pressure of an atmosphere for producing plasma, the amount of supplied source gas, or the like. In the case where the ion implantation is performed by an ion doping method, it is preferable that $H_3^+$ be contained at 50% or more with respect to the total amount of $H^+$, $H_2^+$, and $H_3^+$ in the ion beam, and it is more preferable that the proportion of $H_3^+$ be 80% or more. When $H_3^+$ is contained at 80% or more, the proportion of $H_2^+$ ions in the ion beam gets smaller relatively, which results in lower variation in the average penetration depth of the hydrogen ions contained in the ion beam. Consequently, the ion implantation efficiency improves and the cycle time can be shortened.

Further, $H_3^+$ has larger mass than $H^+$ and $H_2^+$. When the ion beam containing a higher proportion of $H_3^+$ is compared with the ion beam containing a higher proportion of $H^+$ and $H_2^+$, the former can implant hydrogen into a shallower region of the bond substrate 200 than the latter even if the acceleration voltage at the time of doping is the same. Moreover, the former has a steep concentration distribution of hydrogen implanted into the bond substrate 200 in a thickness direction, the embrittlement layer 202 itself can be formed to be thinner.

In the case of performing ion implantation by an ion doping method with the use of a hydrogen gas, the acceleration voltage is set to greater than or equal to 10 kV and less than or equal to 200 kV and the dosage is set to greater than or equal to $1\times10^{16}$ ions/cm$^2$ and less than or equal to $6\times10^{16}$ ions/cm$^2$. Under this condition, the embrittlement layer 202 can be formed in a region at a depth of greater than or equal to 50 nm and less than or equal to 500 nm from the surface of the bond substrate 200, though depending on the ion species included in the ion beam and its proportion, and the film thickness of the insulating film 201.

For example, in the case where the bond substrate 200 is a single crystal silicon substrate and the insulating film 201 is formed using a 100-nm-thick thermal oxide film, a semiconductor film with a thickness of approximately 146 nm can be separated from the bond substrate 200 under the condition where the flow rate of 100% hydrogen gas, which is the source gas, is 50 sccm, the beam current density is 5 $\mu$A/cm$^2$, the acceleration voltage is 50 kV, and the dosage is $2.0\times10^{16}$ ions/cm$^2$. Note that even if the condition at the time of adding hydrogen to the bond substrate 200 is not changed, the thickness of the insulating film 201 is made larger, whereby the thickness of the semiconductor film can be made smaller.

Helium (He) can alternatively be used as the source gas of the ion beam. Since most of the ion species produced by exciting helium are He$^+$, He$^+$ can be mainly implanted into the bond substrate 200 even by an ion doping method in which mass separation is not performed. Therefore, microvoids can be formed in the embrittlement layer 202 efficiently by an ion doping method. In the case of performing the ion implantation by an ion doping method using helium, the acceleration voltage can be set to greater than or equal to 10 kV and less than or equal to 200 kV and the dosage can be set to greater than or equal to $1\times10^{16}$ ions/cm$^2$ and less than or equal to $6\times10^{16}$ ions/cm$^2$.

A halogen gas such as a chlorine gas ($Cl_2$ gas) or a fluorine gas ($F_2$ gas) can be used for the source gas.

In the case where ions are implanted into the bond substrate 200 by an ion doping method, impurities existing in an ion doping apparatus are implanted together with the ions to a processing object; therefore, there is a possibility that impurities such as S, Ca, Fe, and Mo exist on and near the surface of the insulating film 201. Therefore, a region on and near the surface of the insulating film 201 where the number of impurities is considered to be the largest may be removed by etching, polishing, or the like. Specifically, a region at a depth of 10 nm to 100 nm, preferably, approximately 30 nm to 70 nm from the surface of the insulating film 201 may be removed. The dry etching may employ, a reactive ion etching (RIE) method such as an inductively coupled plasma (ICP) etching method, an electron cyclotron resonance (ECR) etching method, a parallel plate (capacitive coupled plasma) etching method, a magnetron plasma etching method, a dual-frequency plasma etching method, or a helicon wave plasma etching method. For example, in the case of removing a region on and near a surface of a silicon nitride oxide film by an ICP etching method, the region can be removed to a depth of about 50 nm from the surface under the condition where the flow rate of $CHF_3$ as an etching gas is 7.5 sccm, the flow rate of He is 100 sccm, the reaction pressure is 5.5 Pa, the temperature of a lower electrode is 70° C., the RF (13.56 MHz) electric power applied to a coil-shaped electrode is 475 W, the electric power applied to the lower electrode (on bias side) is 300 W, and the etching time is about 10 seconds.

Instead of $CHF_3$, which is a fluorine-based gas, a chlorine-based gas such as $Cl_2$, $BCl_3$, $SiCl_4$, or $CCl_4$; another fluorine-based gas such as $CF_4$, $SF_6$, or $NF_3$; or $O_2$ can be used as appropriate for the etching gas. Moreover, an inert gas other than He may be added to the etching gas. For example, one or plural elements selected from Ne, Ar, Kr, or Xe can be used as the inert element which is added to the etching gas. In the case of removing a region on and near a surface of a silicon nitride oxide film by wet etching, a fluorinated acid based solution including ammonium hydrogen fluoride, ammonium fluoride, or the like may be used as an etchant. The polishing can be performed by CMP (chemical mechanical polishing), liquid jet polishing, or the like.

After the formation of the embrittlement layer 202, the region on and near the surface of the insulating film 201 where the contamination is remarkable is removed by etching, polishing, or the like, whereby the number of impurities which enter the semiconductor film 204 formed over the base substrate 203 can be suppressed. In the semiconductor device which is completed finally, it is possible to prevent the impurities from causing decrease in reliability and decrease in electrical characteristics of transistors, such as variation in threshold voltage and increase in leakage current.

Figure 3C:
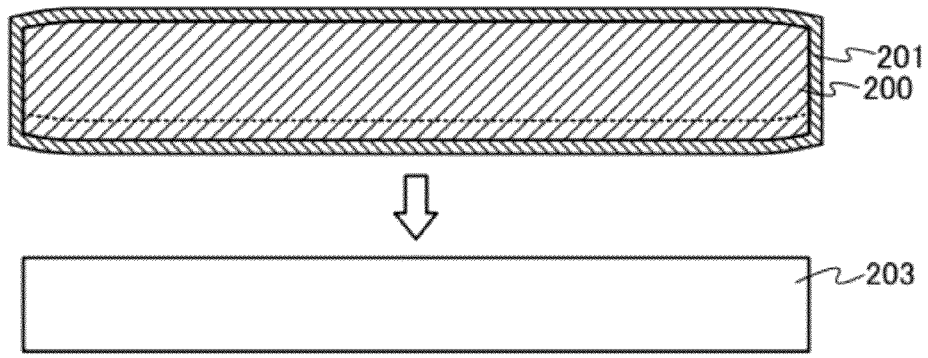
Figure 3D:
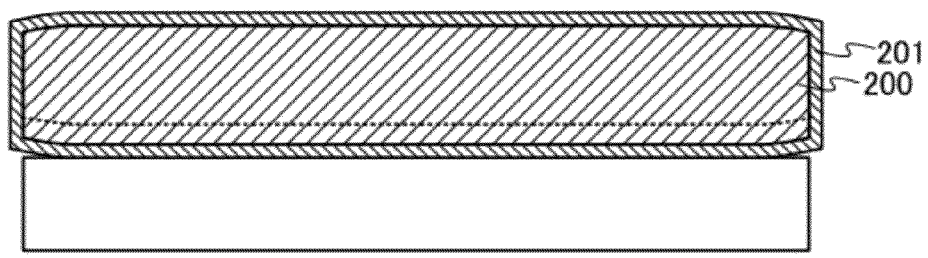

Next, as illustrated in FIG. 3C and FIG. 3D, the bond substrate 200 and the base substrate 203 are attached to each other with the insulating film 201 sandwiched therebetween.

Note that before the base substrate 203 and the bond substrate 200 are attached to each other, surface treatment for improving the bonding strength between the insulating film 201 and the base substrate 203 is preferably performed on surfaces for bonding, that is, in this embodiment, surfaces of the base substrate 203 and the insulating film 201 formed over the bond substrate 200.

As examples of the surface treatment, wet treatment, dry treatment, and combination of wet treatment and dry treatment can be given. Different kinds of wet treatment or different kinds of dry treatment may be combined to be performed. Examples of the wet treatment include ozone treatment using ozone water (ozone water cleaning), ultrasonic cleaning such as megasonic cleaning, two-fluid cleaning (a method in which functional water such as pure water or hydrogenated water and a carrier gas such as nitrogen are sprayed together), cleaning with hydrochloric acid and a hydrogen peroxide solution, and the like. As examples of the dry treatment, inert gas neutral atomic beam treatment, inert gas ion beam treatment, ultraviolet treatment, ozone treatment, plasma treatment, plasma treatment with bias application, radical treatment, and the like can be given. By performing the above-described surface treatment, the hydrophilicity and cleanliness of the surfaces for attaching can be increased. Thus, the bonding strength can be improved.

For the attaching, the base substrate 203 and the insulating film 201 formed over the bond substrate 200 are disposed in close contact with each other, and then, a pressure of approximately 1 $N/cm^2$ to 500 $N/cm^2$, preferably, 11 $N/cm^2$ to 20 $N/cm^2$ is applied to part of the base substrate 203 and the bond substrate 200 which are superposed on each other. When the pressure is applied, bonding between the base substrate 203 and the insulating film 201 starts from the portion, which results in bonding between entire surfaces of the base substrate 203 and the insulating film 201 which are in close contact with each other.

The bonding is performed by Van der Waals force or a hydrogen bond, so that the bonding is firm even at room temperature. Note that since the above-described bonding can be performed at a low temperature, a variety of substrates can be used for the base substrate 203. For example, a variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 203. As the base substrate 203, alternatively, a semiconductor substrate formed of silicon, gallium arsenide, indium phosphide, or the like can be used. Further alternatively, a metal substrate including a stainless steel substrate may be used as the base substrate 203. Substrates with coefficients of thermal expansion of greater than or equal to $25 \times 10^{-7}/°C$. and less than or equal to $50 \times 10^{-7}/°C$. (preferably, greater than or equal to $30 \times 10^{-7}/°C$. and less than or equal to $40 \times 10^{-7}/°C$.) and strain points of greater than or equal to 580° C. and less than or equal to 680° C. (preferably, greater than or equal to 600° C. and less than or equal to 680° C.) are preferably used as the glass substrate which serves as the base substrate 203. When the glass substrate is an alkali-free glass substrate, impurity contamination of semiconductor devices can be suppressed.

As the glass substrate, a mother glass substrate developed for liquid crystal panel production can be used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. By the use of a large-sized mother glass substrate as the base substrate 203 to manufacture an SOI substrate, the SOI substrate can have a larger area. Size increase of an SOI substrate can be realized by using a large-area substrate such as a mother glass substrate, as the base substrate 203. When the SOI substrate can have a larger area, a large number of chips such as ICs or LSIs can be manufactured at one time and the number of chips manufactured from one substrate increases. As a result, the productivity can be improved drastically.

If the base substrate 203 is a glass substrate that largely shrinks when heat treatment is performed thereon, such as EAGLE 2000 (manufactured by Corning Incorporated), defective bonding may occur after the bonding step. Therefore, in order to avoid such defective bonding that is caused by the shrink, the base substrate 203 may be subjected to heat treatment in advance before the bonding step.

Moreover, an insulating film may be formed in advance over the base substrate 203. The base substrate 203 is not necessarily provided with an insulating film on its surface.

However, the formation of the insulating film on the surface of the base substrate 203 can prevent impurities of the base substrate 203, such as an alkali metal and an alkaline earth metal, from entering the bond substrate 200. Moreover, in the case of forming the insulating film on the surface of the base substrate 203, the insulating film over the base substrate 203 is bonded to the insulating film 201; therefore, a wider variety of substrates can be used as the base substrate 203. In general, the upper temperature limits of substrates formed of flexible synthetic resins such as plastics tend to be low. However, as long as the substrates can resist process temperatures in manufacturing steps of a semiconductor element performed later, the substrates formed of such resins can be used as the base substrate 203 in the case of forming the insulating film over the base substrate 203. In addition, polyester typified by polyethylene terephthalate (PET); polyether sulfone (PES); polyethylene naphthalate (PEN); polycarbonate (PC); polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin; and the like can be given. In the case of forming the insulating film over the base substrate 203, the attachment of the base substrate 203 and the bond substrate 200 to each other is preferably performed after surface treatment is performed on the surface of this insulating film in a manner similar to the insulating film 201.

After the bond substrate 200 is attached to the base substrate 203, heat treatment is preferably performed in order to increase the bonding force at the bonding interface between the base substrate 203 and the insulating film 201. This treatment is performed at a temperature where a crack is not generated in the embrittlement layer 202 and can be performed at a temperature in the range of greater than or equal to 200° C. and less than or equal to 400° C. By attaching the bond substrate 200 to the base substrate 203 within this temperature range, the bonding force between the base substrate 203 and the insulating film 201 can be strengthened.

If the bonding plane is contaminated by dust or the like at the time of attaching the bond substrate 200 and the base substrate 203 to each other, the contaminated portion is not bonded. In order to avoid the contamination of the bonding plane, the bond substrate 200 and the base substrate 203 are preferably attached to each other in an airtight chamber. At the time of attaching the bond substrate 200 and the base substrate 203 to each other, the process chamber may have pressure reduced to about $5.0 \times 10^{-3}$ Pa and the atmosphere of the bonding process may be cleaned.

Figure 4A:
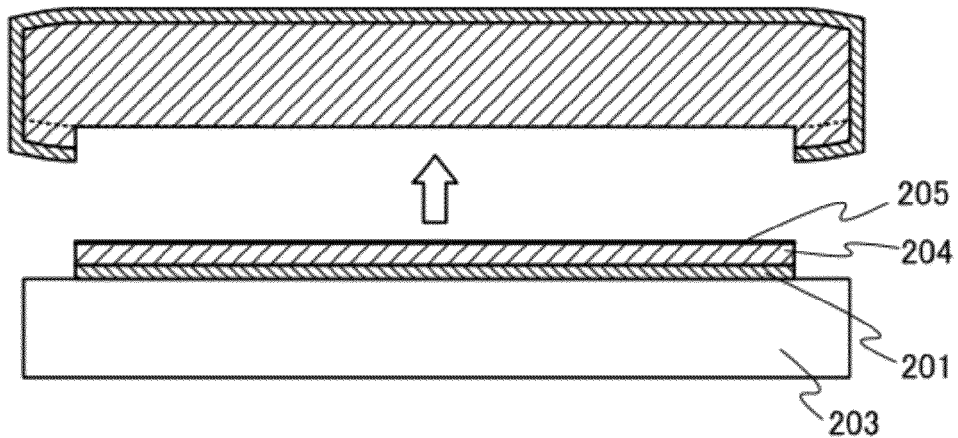
FIGS. 4A to 4D are diagrams illustrating a manufacturing method according to one embodiment of the present invention.

Next, heat treatment is performed, whereby microvoids which are adjacent to each other in the embrittlement layer 202 are combined and the volume of the microvoids increases. As a result, as illustrated in FIG. 4A, the semiconductor film 204 which is part of the bond substrate 200 is separated from the bond substrate 200 along the embrittlement layer 202. Since the insulating film 201 and the base substrate 203 are bonded to each other, the semiconductor film 204 which is separated from the bond substrate 200 is fixed to the base substrate 203. The heat treatment for separating the semiconductor film 204 from the bond substrate 200 is preferably performed at a temperature which does not exceed the strain point of the base substrate 203.

For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. In the case of using a GRTA apparatus, a heating temperature can be set at greater than or equal to 550° C. and less than or equal to 650° C., and processing time can be set at greater than or equal to 0.5 minute and less than or equal to 60 minutes. In the case of using a resistance heating apparatus, the heating temperature can be set at greater than or equal to 200° C. and less than or equal to 650° C., and processing time can be set at greater than or equal to 2 hours and less than or equal to 4 hours.

The heat treatment may be performed by dielectric heating with a high-frequency wave such as a microwave. The heat treatment by dielectric heating can be performed by irradiating the bond substrate 200 with a high-frequency wave with a frequency of 300 MHz to 3 THz generated by a high-frequency wave generation apparatus. Specifically, for example, irradiation with a microwave with a frequency of 2.45 GHz at 900 W is performed for 14 minutes to combine microvoids adjacent to each other in the embrittlement layer, whereby the bond substrate 200 can be split along the embrittlement layer finally.

A specific treatment method of heat treatment using a vertical furnace with resistance heating is described. The base substrate 203 to which the bond substrate 200 is attached is disposed on a boat of the vertical furnace and this boat is delivered in a chamber of the vertical furnace. In order to suppress oxidation of the bond substrate 200, the chamber is evacuated first such that a vacuum state is formed. The degree of vacuum is approximately $5 \times 10^{-3}$ Pa. After a vacuum state is obtained, nitrogen is supplied to the chamber so that the chamber has a nitrogen atmosphere under atmospheric pressure. In this period, the heat temperature is increased to 200° C.

After the chamber is made to have a nitrogen atmosphere under atmospheric pressure, heating is performed at 200° C. for two hours. Then, the temperature is increased to 400° C. in one hour. After the state at a heating temperature of 400° C. is stabilized, the temperature is increased to 600° C. in one hour. After a state in which the heating temperature is 600° C. becomes stable, heat treatment is performed at 600° C. for two hours. Then, the temperature is decreased to 400° C. in one hour, and after 10 minutes to 30 minutes, the boat is carried out from the chamber. The base substrate 203 to which the bond substrate 200 and the semiconductor film 204 are attached and which is disposed on the boat is cooled under an atmospheric atmosphere.

The heat treatment using the above resistance heating furnace is performed by successively performing heat treatment for strengthening the bonding force between the insulating film 201 and the base substrate 203 and heat treatment for splitting the embrittlement layer 202. In the case of performing these two kinds of heat treatment in different apparatuses, for example, heat treatment is performed at 200° C. for two hours in a resistance heating furnace and then the base substrate 203 and the bond substrate 200 which are attached to each other are carried out from the furnace. Next, heat treatment is performed by an RTA apparatus at a process temperature of greater than or equal to 600° C. and less than or equal to 700° C. for one minute to several hours, so that the bond substrate 200 is split along the embrittlement layer 202.

Note that in some cases, a periphery of the bond substrate 200 is not bonded to the base substrate 203. It is likely that this is because the periphery of the bond substrate 200 is chamfered or has a curvature, so that the base substrate 203 and the insulating film 201 are not in close contact with each other or the embrittlement layer 202 is difficult to split at the periphery of the bond substrate 200. Another reason is that polishing such as CMP performed in manufacturing the bond substrate 200 is insufficient at the periphery of the bond substrate 200, so that a surface thereof is rougher at the periphery than at a center. Still another reason is that, in the case where a carrier or the like damages the periphery of the bond substrate 200 at the time of delivery of the bond substrate 200, the damage makes it difficult to bond the periphery to the base substrate 203. For these reasons, the semiconductor film 204 which is smaller than the bond substrate 200 is attached to the base substrate 203.

Note that the bond substrate 200 may be subjected to hydrogenation treatment before the bond substrate 200 is split. The hydrogenation treatment is performed, for example, at 350° C. for approximately two hours in a hydrogen atmosphere.

If a plurality of bond substrates 200 are attached to the base substrate 203, the plurality of bond substrates 200 may have different crystal plane orientation. The mobility of majority carriers in a semiconductor depends on crystal plane orientation. Therefore, the semiconductor film 204 may be formed by selecting as appropriate the bond substrate 200 which has crystal plane orientation suitable for a semiconductor element to be formed. For example, in the case of forming an n-type semiconductor element with the use of the semiconductor film 204, the formation of the semiconductor film 204 with a {100} plane can increase the mobility of majority carriers in the semiconductor element. On the other hand, for example, in the case of forming a p-type semiconductor element with the use of the semiconductor film 204, the formation of the semiconductor film 204 with a {110 } plane can increase the mobility of majority carriers in the semiconductor element. Then, in the case of forming a transistor as a semiconductor element, the bonding direction of the semiconductor film 204 is determined in consideration of a channel direction and crystal plane orientation.

Next, a surface of the semiconductor film 204 may be planarized by polishing. Although the planarization is not necessarily essential, the planarization makes it possible to improve characteristics of the interface between a gate insulating film and semiconductor films 211 and 212 which are to be formed later. Specifically, the polishing may be chemical mechanical polishing (CMP), liquid jet polishing, or the like. The thickness of the semiconductor film 204 is reduced by the above-described planarization. The planarization may be performed on the semiconductor film 204 before being etched; alternatively, the planarization may be performed on the semiconductor films 211 and 212 formed by etching.

Not the polishing but etching may be performed on the surface of the semiconductor film 204 in order to planarize the surface of the semiconductor film 204. The etching may be performed using a dry etching method such as a reactive ion etching (RIE) method; for example, an inductively coupled plasma (ICP) etching method, an electron cyclotron resonance (ECR) etching method, a parallel plate (capacitive coupled type) etching method, a magnetron plasma etching method, a dual-frequency plasma etching method, a helicon wave plasma etching method, or the like may be used.

For example, when an ICP etching method is used, etching may be performed under the following conditions: the flow rate of chlorine, which is an etching gas: 40 sccm to 100 sccm; electric power applied to a coil-shaped electrode: 100 W to 200 W; the power applied to a lower electrode (on the bias side): 40 W to 100 W; and the reaction pressure: 0.5 Pa to 1.0 Pa. For example, the thickness of the semiconductor film 204 can be reduced to about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 seconds to 27 seconds. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

By the etching, the thickness of the semiconductor film 204 can be reduced to be optimal for a semiconductor element to be formed later and the surface of the semiconductor film 204 can be planarized, as well.

Figure 4B:
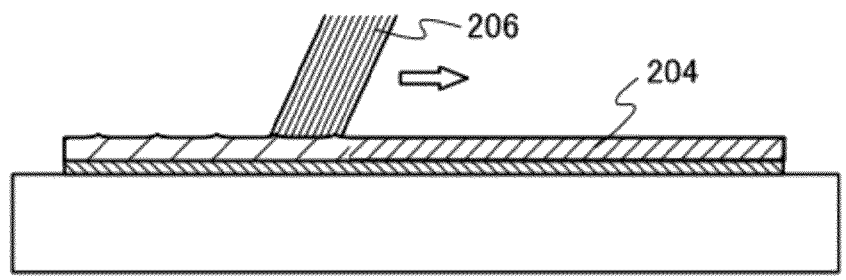

Note that in the semiconductor film 204 bonded to the base substrate 203, crystal defects are formed due to the formation of the embrittlement layer 202 and the split along the embrittlement layer 202, and thus planarity of the surface of the semiconductor film 204 is impaired. Thus, in one embodiment of the present invention, in order to reduce crystal defects and improve planarity, the semiconductor film 204 is irradiated with first laser light as illustrated in FIG. 4B after a process of removing an oxide film 205 such as a natural oxide film which is formed on the surface of the semiconductor film 204.

Note that Embodiment 1 can be referred to for a specific procedure of the process of removing the oxide film 205. In this embodiment, the semiconductor film 204 is immersed in DHF having a hydrogen fluoride concentration of 0.5 wt % for 110 seconds, whereby the oxide film 205 is removed.

Figure 4C:
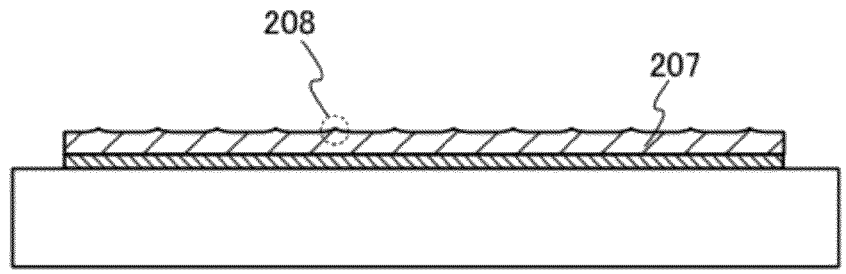

The first laser light irradiation is performed mainly for repairing crystal defects in the semiconductor film 204. As illustrated in FIG. 4B, scanning is performed with laser light 206 in a direction indicated by an arrow, whereby the crystal defects in the semiconductor film 204 are repaired. Then, through the first laser light irradiation, a semiconductor film 207 whose crystal defects have been repaired is formed as illustrated in FIG. 4C.

Embodiment 1 can be referred to for a specific procedure of the first laser light irradiation. Specifically, in this embodiment, in the case where the thickness of the semiconductor film 204 is about 146 nm, the first laser light irradiation can be performed in the following manner. As a laser emitting laser light, a XeCl excimer laser (wavelength: 308 nm, pulse width: 20 nanoseconds, and repetition rate: 30 Hz) is used. The cross section of the laser light is shaped into a linear form with a size of 0.4 mm×120 mm through an optical system. The laser scanning speed is 0.5 mm/s, the scanning pitch is 16.7 μm, and the beam shot number is about 24; in this manner, the semiconductor film 204 is irradiated with the laser light.

In order to perform the first laser light irradiation in a reduced-pressure atmosphere or an inert atmosphere such as a rare gas atmosphere or a nitrogen atmosphere, the first laser light irradiation may be performed in an airtight chamber whose atmosphere is controlled. If the chamber is not used, the laser light irradiation in an inert atmosphere can be achieved by spraying an inert gas such as a nitrogen gas to the surface to be irradiated with the laser light. The first laser light irradiation is performed in an inert atmosphere or a reduced-pressure atmosphere instead of an air atmosphere, whereby the natural oxide film is further prevented from being formed, cracks or pitch stripes can be prevented from being formed in the semiconductor film 207 which is formed after the laser light irradiation, planarity of the semiconductor film 207 can be improved, and the applicable energy range for the laser light can be widened.

In the case where the surface of the semiconductor film 204 is planarized by dry etching before the first laser light irradiation, damages such as crystal defects might be generated on and near the surface of the semiconductor film 204 due to the dry etching. However, the aforementioned laser light irradiation can repair even the damages caused by the dry etching.

Note that as described above, the first laser light irradiation is performed in an inert atmosphere or a reduced-pressure atmosphere instead of an air atmosphere, whereby the natural oxide film can be further prevented from being formed on the surface of the semiconductor film 207. Since the first laser light irradiation is performed mainly for repairing crystallinity, the number of shots of the first laser light is made larger than that of second laser light which is to be emitted later. Therefore, a small amount of oxygen in the atmosphere and a semiconductor are easily reacted with each other and the natural oxide film is easily formed in the first laser light irradiation as compared with those in the second laser light irradiation. Therefore, there is a possibility that pitch stripes 208 which correspond to a rough region having crater-shaped or granular unevenness are generated on the surface of the semiconductor film 207 due to the natural oxide film, depending on the scanning interval.

Figure 4D:
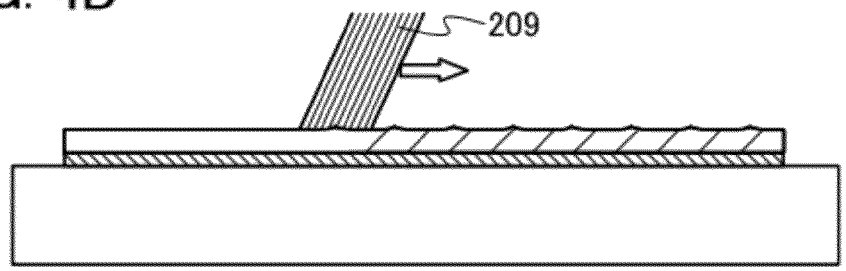
Figure 5A:
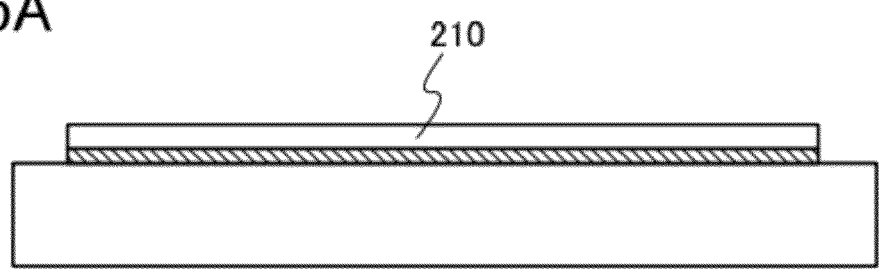
FIGS. 5A to 5C are diagrams illustrating a manufacturing method according to one embodiment of the present invention.

In order to improve the planarity of the semiconductor film 207, specifically, to reduce a difference in height due to the pitch stripes 208 formed on the surface of the semiconductor film 207, or to reduce the number of pitch stripes, the semiconductor film 207 is irradiated with the second laser light in one embodiment of the present invention as illustrated in FIG. 4D. As illustrated in FIG. 4D, scanning is performed with laser light 209 in a direction indicated by an arrow, whereby the planarity of the semiconductor film 207 is improved. Then, through the second laser light irradiation, a semiconductor film 210 whose planarity is high is formed as illustrated in FIG. 5A.

Embodiment 1 can be referred to for a specific procedure of the second laser light irradiation. Specifically, in this embodiment, in the case where the thickness of the semiconductor film 207 is about 146 nm, the second laser light irradiation can be performed in the following manner. As a laser emitting laser light, a XeCl excimer laser (wavelength: 308 nm, pulse width: 20 nanoseconds, and repetition rate: 30 Hz) is used. The cross section of the laser light is shaped into a linear form with a size of 0.4 mm×120 mm through an optical system. The laser scanning speed is 8.0 mm/s, the scanning pitch is 267 μm, and the beam shot number is about 1.5; in this manner, the semiconductor film 207 is irradiated with the laser light.

The number of shots of the second laser light is smaller than that of the first laser light because the second laser light irradiation is performed mainly for planarizing the surface of the semiconductor film. Therefore, cracks due to a natural oxide film are less likely to be formed in the semiconductor film. However, in the case where higher planarity is preferred, a natural oxide film which might be formed on the surface of the semiconductor film 207 may be removed before the second laser light irradiation. Embodiment 1 can be referred to for removal of the natural oxide film.

Next, after the second laser light irradiation, the surface of the semiconductor film 210 may be etched. If the surface of the semiconductor film 210 is etched after the second laser light irradiation, the surface of the semiconductor film 204 is not necessarily etched before the first laser light irradiation. Moreover, if the surface of the semiconductor film 204 is etched before the first laser light irradiation, the surface of the semiconductor film 210 is not necessarily etched after the second laser light irradiation. Alternatively, the surface of the semiconductor film 207 may be etched after the first laser light irradiation and before the second laser light irradiation. Still alternatively, the surface of the semiconductor film 207 may be etched at all the following timing: before the first laser light irradiation; after the first laser light irradiation and before the second laser light irradiation; and after the second laser light irradiation.

By the etching, the thickness of the semiconductor film 210 can be reduced to be optimal for a semiconductor element to be formed later and the surface of the semiconductor film 210 can be planarized, as well.

After the laser irradiation, the semiconductor film 210 is preferably subjected to heat treatment at greater than or equal to 500° C. and less than or equal to 650° C. This heat treatment can repair defects of the semiconductor film 210 which have not been repaired in the laser light irradiation and can reduce distortion of the semiconductor film 210. For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. For example, in the case of using a resistance heating furnace, heat treatment is performed at 500° C. for an hour and then another heat treatment is performed at 550° C. for four hours.

Figure 5B:
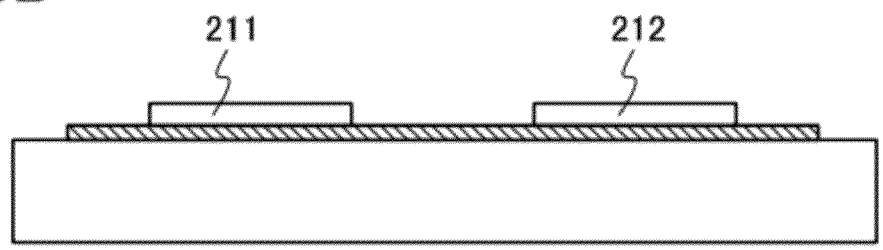

Next, as illustrated in FIG. 5B, the semiconductor film 210 is partly etched to form the island-shaped semiconductor films 211 and 212. When the semiconductor film 210 is further etched, end portions of the semiconductor film 210 where the bonding strength is not sufficient can be removed.

Although the semiconductor films 211 and 212 are formed by etching one semiconductor film 210 in this embodiment, the number of semiconductor films which are formed is not limited to two.

Figure 5C:
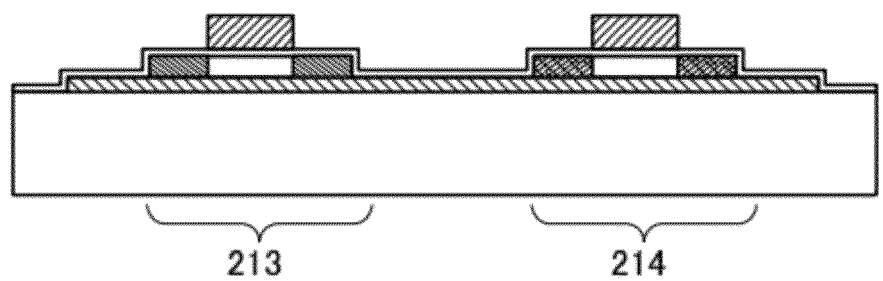

With the use of the semiconductor films 211 and 212 formed through the above steps, for example, a variety of semiconductor elements such as a transistor 213 and a transistor 214 shown in FIG. 5C can be formed.

Note that the surface of the bond substrate 200 from which the semiconductor film 210 is separated is planarized, whereby a semiconductor film can be separated again from the bond substrate 200.

Specifically, the insulating film 201 which remains mainly at ends of the bond substrate 200 is removed by etching or the like. In the case where the insulating film 201 is formed using silicon oxide, silicon oxynitride, silicon nitride oxide, or the like, wet etching using hydrofluoric acid can be employed.

Next, projections formed at the periphery of the bond substrate 200 due to the separation of the semiconductor film 210 and the remaining embrittlement layer which contains hydrogen excessively are removed. For the etching of the bond substrate 200, wet etching is preferably used, and a tetramethylammonium hydroxide (abbreviation: TMAH) solution can be used as an etchant.

Then, the surface of the bond substrate 200 is polished. For the polishing, CMP can be used. To smooth the surface of the bond substrate 200, the surface is desirably polished by approximately 1 μm to 10 μm in thickness. After the polishing, RCA cleaning using hydrofluoric acid or the like is performed because abrasive particles and the like are left on the surface of the bond substrate 200.

By reusing the bond substrate 200, the cost of a material of the semiconductor substrate can be reduced.

Through the above steps, an SOI substrate according to one embodiment of the present invention can be manufactured. Further, a variety of semiconductor elements are manufactured with use of the semiconductor film 210, whereby a semiconductor device can be manufactured. According to one embodiment of the present invention, an SOI substrate including a semiconductor film with high planarity and high crystallinity can be provided without using a laser light irradiation apparatus that can control an atmosphere at high level. In addition, a method for manufacturing a semiconductor device whose variation in characteristics is reduced and which includes a semiconductor element with favorable characteristics can be provided without using a laser light irradiation apparatus that can control an atmosphere at high level.

One embodiment of the present invention can be applied to manufacture of any kind of semiconductor devices including microprocessors, integrated circuits such as image processing circuits, RF tags for transmitting and receiving data to/from an interrogator without contact, and semiconductor display devices. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

This embodiment can be implemented in combination with the above embodiment in this specification.

Embodiment 3

In this embodiment, methods for manufacturing an SOI substrate and a semiconductor device in the case where an insulating film is formed over a base substrate will be described.

Figure 6A:
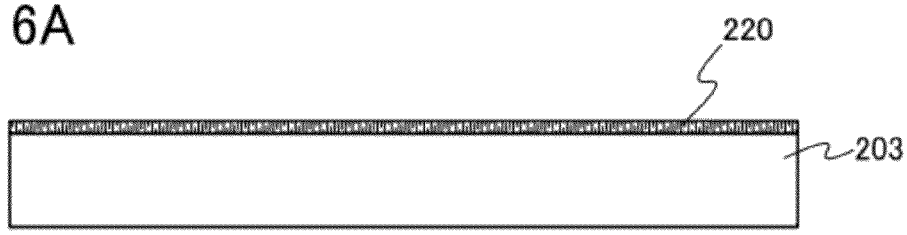
FIGS. 6A to 6D are diagrams illustrating a manufacturing method according to one embodiment of the present invention.

First, as illustrated in FIG. 6A, an insulating film 220 is formed on at least one surface of a base substrate 203. The formation of the insulating film 220 on the surface of the base substrate 203 can prevent impurities of the base substrate 203, such as an alkali metal and an alkaline earth metal, from entering a bond substrate 200.

As described in Embodiment 2, a variety of substrates can be used as the base substrate 203. For example, a variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 203. As the base substrate 203, alternatively, a semiconductor substrate formed of silicon, gallium arsenide, indium phosphide, or the like can be used. Further alternatively, a metal substrate including a stainless steel substrate may be used as the base substrate 203. Substrates with coefficients of thermal expansion of greater than or equal to $25 \times 10^{-7}/°$ C. and less than or equal to $50 \times 10^{-7}/°$ C. (preferably, greater than or equal to $30 \times 10^{-7}/°$ C. and less than or equal to $40 \times 10^{-7}/°$ C.) and strain points of greater than or equal to 580° C. and less than or equal to 680° C. (preferably, greater than or equal to 600° C. and less than or equal to 680° C.) are preferably used as the glass substrate which serves as the base substrate 203. When the glass substrate is an alkali-free glass substrate, impurity contamination of semiconductor devices can be suppressed.

As the glass substrate, a mother glass substrate developed for production of liquid crystal panels can be used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. When an SOI substrate is manufactured using a large-sized mother glass for the base substrate 203, the SOI substrate can have a large area. By the use of a large-area substrate like a mother glass substrate as the base substrate 203, an SOI substrate can have a larger area. When the SOI substrate can have a larger area, a large number of chips such as ICs or LSIs can be manufactured at one time and the number of chips manufactured from one substrate increases. As a result, the productivity can be improved drastically.

If the base substrate 203 is a glass substrate that largely shrinks when heat treatment is performed thereon, such as EAGLE 2000 (manufactured by Corning Incorporated), defective bonding may occur after the bonding step. Therefore, in order to avoid such defective bonding that is caused by the shrink, the base substrate 203 may be subjected to heat treatment in advance before the bonding step.

In the case of forming the insulating film 220 on the surface of the base substrate 203, the insulating film 220 over the base substrate 203 is bonded to the insulating film 201 over the bond substrate 200; therefore, a wider variety of substrates can be used as the base substrate 203. In general, the upper temperature limits of substrates formed of flexible synthetic resins such as plastics tend to be low. However, as long as the substrates can resist process temperatures in later steps of manufacturing semiconductor elements, the substrates formed of such resins can be used as the base substrate 203. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

As a film included in the insulating film 220, an insulating film including silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride; or an insulating film including a metal nitride oxide such as an aluminum nitride oxide can also be used.

In the case where the base substrate 203 includes an impurity which decreases the reliability of a semiconductor device, such as an alkali metal or an alkaline earth metal, the insulating film 220 preferably includes at least one layer of a barrier film that can prevent such an impurity from diffusing from the base substrate 203 into a semiconductor film which is to be formed after separation. As the insulating film that can be used as the barrier film, a silicon nitride film, a silicon nitride oxide film, an aluminum nitride film, an aluminum nitride oxide film, or the like can be given. The insulating film that is used as the barrier film is preferably formed to have a thickness of 15 nm to 300 nm, for example. Such a barrier film has a high blocking effect for preventing impurity diffusion; however, the internal stress is high. Therefore, in the case where a barrier film is used for the insulating film 220, as the insulating film 201 on the bond substrate 200, a film with an effect of relieving the stress of the insulating film 220 is preferable. As the insulating film with the effect of relieving the stress of the barrier film, a silicon oxide film, a thermally oxidized film formed by thermally oxidizing the bond substrate 200, or the like is given.

In the case of using silicon oxide as the insulating film 201, the insulating film 220 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 220 may be densified by oxygen plasma treatment. In the case of using silicon nitride as the insulating film 220, the insulating film 220 can be formed by a vapor deposition method such as a plasma CVD method using a mixed gas of silane and ammonia. In the case of using silicon nitride oxide as the insulating film 220, the insulating film 220 can be formed by a vapor deposition method such as a plasma CVD method using a mixed gas of silane and ammonia or a mixed gas of silane and nitrogen oxide.

Furthermore, the insulating film 220 may be made of silicon oxide that is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

By the use of an organosilane gas for the source gas, a silicon oxide film with a flat surface can be formed at a process temperature of 350° C. or lower. Alternatively, low temperature oxide (LTO) formed at a temperature of greater than or equal to 200° C. and less than or equal to 500° C. by a thermal CVD method can be used. For formation of the LTO, monosilane ($SiH_4$), disilane ($Si_2H_6$), or the like can be used as a silicon source gas, and dinitrogen monoxide ($N_2O$) or the like can be used as an oxygen source gas.

For example, in the case of using TEOS and $O_2$ for the source gas to form the silicon oxide film as the insulating film 220, the condition may be set as follows: the flow rate of TEOS is 15 sccm, the flow rate of $O_2$ is 750 sccm, the film forming pressure is 100 Pa, the film forming temperature is 300° C., the RF output is 300 W, and the power source frequency is 13.56 MHz.

Note that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the insulating film at a low temperature. A siloxane bond, which is a covalent bond, is formed finally between the base substrate and the insulating film. The insulating film such as the aforementioned silicon oxide film formed using organosilane or the LTO formed at a relatively low temperature is suitable for bonding at a low temperature, as compared with a thermally oxidized film having no OH bonds or having very few OH bonds which is used in Smart Cut (registered trademark) or the like.

Since the insulating film 201 serves as a bonding plane, the average surface roughness $R_a$ of the insulating film 201 is preferably less than or equal to 0.7 nm, more preferably less than or equal to 0.4 nm. In addition, the thickness of the insulating film 201 can be made greater than or equal to 10 nm and less than or equal to 200 nm. The thickness of the insulating film 201 is preferably greater than or equal to 5 nm and less than or equal to 500 nm, more preferably greater than or equal to 10 nm and less than or equal to 200 nm.

Figure 6B:
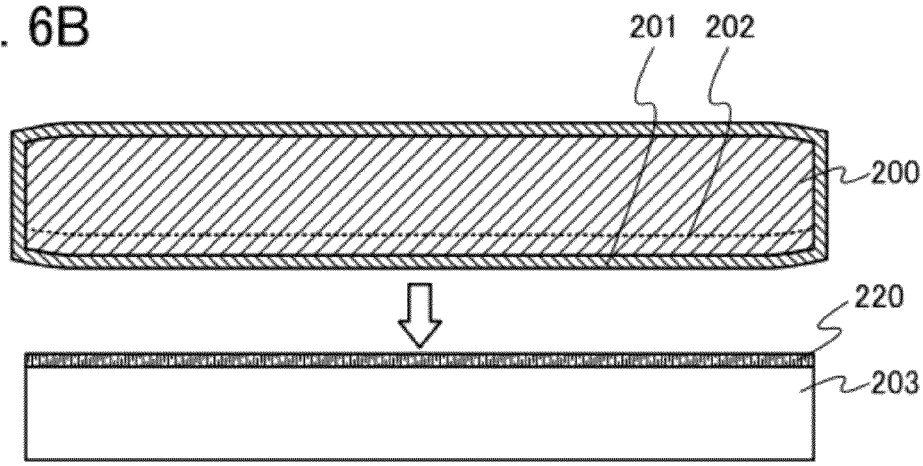

Next, as illustrated in FIG. 6B, the bond substrate 200 in which the embrittlement layer 202 is formed and which is provided with the insulating film 201 on at least its one surface and the base substrate 203 are attached to each other so that the insulating film 201 and the insulating film 220 are in contact with each other. Embodiment 2 can be referred to for the bond substrate 200, the insulating film 201, and the embrittlement layer 202.

Note that before the base substrate 203 and the bond substrate 200 are attached to each other, surface treatment for improving the bonding strength between the insulating film 201 and the base substrate 203 is preferably performed on surfaces for bonding, that is, in this embodiment, surfaces of the insulating film 201 formed over the bond substrate 200 and the insulating film 220 formed over the base substrate 203.

As examples of the surface treatment, wet treatment, dry treatment, and combination of wet treatment and dry treatment can be given. Different kinds of wet treatment or different kinds of dry treatment may be combined to be performed. Examples of the wet treatment include ozone treatment using ozone water (ozone water cleaning), ultrasonic cleaning such as megasonic cleaning, two-fluid cleaning (a method in which functional water such as pure water or hydrogenated water and a carrier gas such as nitrogen are sprayed together), cleaning with hydrochloric acid and a hydrogen peroxide solution, and the like. As examples of the dry treatment, inert gas neutral atomic beam treatment, inert gas ion beam treatment, ultraviolet treatment, ozone treatment, plasma treatment, plasma treatment with bias application, radical treatment, and the like can be given. By performing the above-described surface treatment, the hydrophilicity and cleanliness of the surfaces for attaching can be increased. Thus, the bonding strength can be improved.

For the attaching, the base substrate 203 and the insulating film 201 formed over the bond substrate 200 are disposed in close contact with each other, and then, a pressure of approximately 1 $N/cm^2$ to 500 $N/cm^2$, preferably, 11 $N/cm^2$ to 20 $N/cm^2$ is applied to part of the base substrate 203 and the bond substrate 200 which are superposed on each other. When the pressure is applied, bonding between the base substrate 203 and the insulating film 201 starts from the portion, which results in bonding between entire surfaces of the base substrate 203 and the insulating film 201 which are in close contact with each other.

After the bond substrate 200 is attached to the base substrate 203, heat treatment is preferably performed in order to increase the bonding force at the bonding interface between the insulating film 201 and the insulating film 220. This treatment is performed at a temperature where a crack is not generated in the embrittlement layer 202 and can be performed at a temperature in the range of greater than or equal to 200° C. and less than or equal to 400° C. By attaching the bond substrate 200 to the base substrate 203 within this temperature range, the bonding force between the base substrate 203 and the insulating film 201 can be strengthened.

If the bonding plane is contaminated by dust or the like at the time of attaching the bond substrate 200 and the base substrate 203 to each other, the contaminated portion is not bonded. In order to avoid the contamination of the bonding plane, the bond substrate 200 and the base substrate 203 are preferably attached to each other in an airtight chamber. At the time of attaching the bond substrate 200 and the base substrate 203 to each other, the process chamber may have pressure reduced to about $5.0 \times 10^{-3}$ Pa and the atmosphere of the bonding process may be cleaned.

Figure 6C:
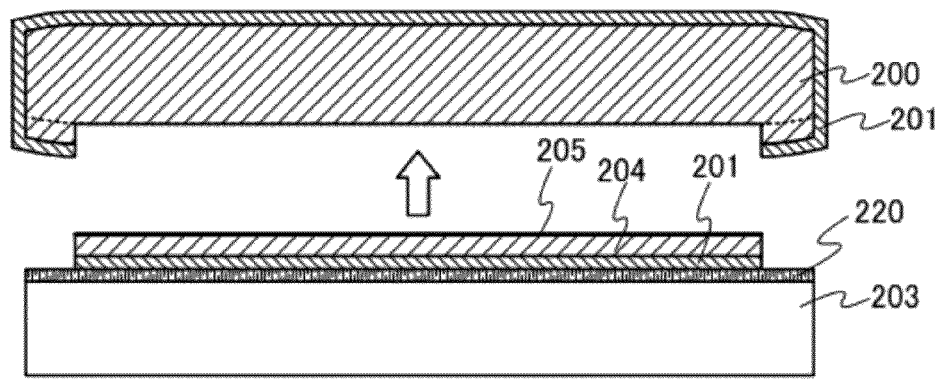

Next, heat treatment is performed, whereby microvoids which are adjacent to each other in the embrittlement layer 202 are combined and the volume of the microvoids increases. As a result, as illustrated in FIG. 6C, the semiconductor film 204 which is part of the bond substrate 200 is separated from the bond substrate 200 along the embrittlement layer 202. Since the insulating film 201 and the insulating film 220 are bonded to each other, the semiconductor film 204 which is separated from the bond substrate 200 is fixed to the base substrate 203. The heat treatment for separating the semiconductor film 204 from the bond substrate 200 is preferably performed at a temperature which does not exceed the strain point of the base substrate 203.

For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. In the case of using a GRTA apparatus, a heating temperature can be set at greater than or equal to 550° C. and less than or equal to 650° C., and processing time can be set at greater than or equal to 0.5 minute and less than or equal to 60 minutes. In the case of using a resistance heating apparatus, the heating temperature can be set at greater than or equal to 200° C. and less than or equal to 650° C., and processing time can be set at greater than or equal to 2 hours and less than or equal to 4 hours.

The heat treatment may be performed by dielectric heating with a high-frequency wave such as a microwave. The heat treatment by dielectric heating can be performed by irradiating the bond substrate 200 with a high-frequency wave with a frequency of 300 MHz to 3 THz generated by a high-frequency wave generation apparatus. Specifically, for example, irradiation with a microwave with a frequency of 2.45 GHz at 900 W is performed for 14 minutes to combine microvoids adjacent to each other in the embrittlement layer, whereby the bond substrate 200 can be split along the embrittlement layer finally.

A specific treatment method of heat treatment using a vertical furnace with resistance heating is described. The base substrate 203 to which the bond substrate 200 is attached is disposed on a boat of the vertical furnace and this boat is delivered in a chamber of the vertical furnace. In order to suppress oxidation of the bond substrate 200, the chamber is evacuated first such that a vacuum state is formed. The degree of vacuum is approximately $5\times10^{-3}$ Pa. After a vacuum state is obtained, nitrogen is supplied to the chamber so that the chamber has a nitrogen atmosphere under atmospheric pressure. In this period, the heat temperature is increased to 200° C.

After the chamber is made to have a nitrogen atmosphere under atmospheric pressure, heating is performed at 200° C. for two hours. Then, the temperature is increased to 400° C. in one hour. After the state at a heating temperature of 400° C. is stabilized, the temperature is increased to 600° C. in one hour. After a state in which the heating temperature is 600° C. becomes stable, heat treatment is performed at 600° C. for two hours. Then, the temperature is decreased to 400° C. in one hour, and after 10 minutes to 30 minutes, the boat is carried out from the chamber. The base substrate 203 to which the bond substrate 200 and the semiconductor film 204 are attached and which is disposed on the boat is cooled under an atmospheric atmosphere.

The heat treatment using the above resistance heating furnace is performed by successively performing heat treatment for strengthening the bonding force at the bonding plane and heat treatment for splitting the embrittlement layer 202. In the case of performing these two kinds of heat treatment in different apparatuses, for example, heat treatment is performed at 200° C. for two hours in a resistance heating furnace and then the base substrate 203 and the bond substrate 200 which are attached to each other are carried out from the furnace. Next, heat treatment is performed by an RTA apparatus at a process temperature of greater than or equal to 600° C. and less than or equal to 700° C. for one minute to several hours, so that the bond substrate 200 is split along the embrittlement layer 202.

Note that in some cases, a periphery of the bond substrate 200 is not bonded to the base substrate 203. It is likely that this is because the periphery of the bond substrate 200 is chamfered or has a curvature, so that the insulating film 201 and the insulating film 220 are not in close contact with each other or the embrittlement layer 202 is difficult to split at the periphery of the bond substrate 200. Another reason is that polishing such as CMP performed in manufacturing the bond substrate 200 is insufficient at the periphery of the bond substrate 200, so that a surface thereof is rougher at the periphery than at a center. Still another reason is that, in the case where a carrier or the like damages the periphery of the bond substrate 200 at the time of delivery of the bond substrate 200, the damage makes it difficult to bond the periphery to the base substrate 203. For these reasons, the semiconductor film 204 which is smaller than the bond substrate 200 is attached to the base substrate 203.

Note that the bond substrate 200 may be subjected to hydrogenation treatment before the bond substrate 200 is split. The hydrogenation treatment is performed, for example, at 350° C. for approximately two hours in a hydrogen atmosphere.

If a plurality of bond substrates 200 are attached to the base substrate 203, the plurality of bond substrates 200 may have different crystal plane orientation. The mobility of majority carriers in a semiconductor depends on crystal plane orientation. Therefore, the semiconductor film 204 may be formed by selecting as appropriate the bond substrate 200 which has crystal plane orientation suitable for a semiconductor element to be formed. For example, in the case of forming an n-type semiconductor element with the use of the semiconductor film 204, the formation of the semiconductor film 204 with a {100} plane can increase the mobility of majority carriers in the semiconductor element. On the other hand, for example, in the case of forming a p-type semiconductor element with the use of the semiconductor film 204, the formation of the semiconductor film 204 with a {110} plane can increase the mobility of majority carriers in the semiconductor element. Then, in the case of forming a transistor as a semiconductor element, the bonding direction of the semiconductor film 204 is determined in consideration of a channel direction and crystal plane orientation.

Next, a surface of the semiconductor film 204 may be planarized by polishing. Although the planarization is not necessarily essential, the planarization makes it possible to improve characteristics of the interface between a gate insulating film and the semiconductor film. Specifically, the polishing may be chemical mechanical polishing (CMP), liquid jet polishing, or the like. The thickness of the semiconductor film 204 is reduced by the above-described planarization.

Not the polishing but etching may be performed on the surface of the semiconductor film 204 in order to planarize the surface of the semiconductor film 204. The etching may be performed using a dry etching method such as a reactive ion etching (RIE) method; for example, an inductively coupled plasma (ICP) etching method, an electron cyclotron resonance (ECR) etching method, a parallel plate (capacitive coupled type) etching method, a magnetron plasma etching method, a dual-frequency plasma etching method, a helicon wave plasma etching method, or the like may be used.

For example, when an ICP etching method is used, etching may be performed under the following conditions: the flow rate of chlorine, which is an etching gas: 40 sccm to 100 sccm;

electric power applied to a coil-shaped electrode: 100 W to 200 W; the electric power applied to a lower electrode (on the bias side): 40 W to 100 W; and the reaction pressure: 0.5 Pa to 1.0 Pa. For example, the thickness of the semiconductor film 204 can be reduced to about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 seconds to 27 seconds. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

By the etching, the thickness of the semiconductor film 204 can be reduced to be optimal for a semiconductor element to be formed later and the surface of the semiconductor film 204 can be planarized, as well.

Note that in the semiconductor film 204 bonded to the base substrate 203, crystal defects are formed due to the formation of the embrittlement layer 202 and the split along the embrittlement layer 202, and thus planarity of the surface of the semiconductor film 204 is impaired. Thus, in one embodiment of the present invention, in order to reduce crystal defects and improve planarity, first laser light irradiation and then, second laser light irradiation are performed after a process of removing an oxide film 205 such as a natural oxide film which is formed on the surface of the semiconductor film 204. Embodiment 1 and Embodiment 2 can be referred to for the process of removing the oxide film 205 such as a natural oxide film, the first laser light irradiation, and the second laser light irradiation.

Figure 6D:
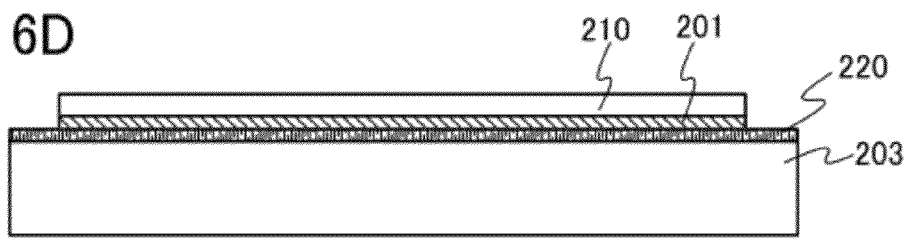

Through the above steps, as illustrated in FIG. 6D, an SOI substrate in which a semiconductor film 210 with improved planarity and favorable crystallinity is formed over the base substrate 203 with the insulating films 201 and 220 sandwiched therebetween can be manufactured. Further, a variety of semiconductor elements are manufactured with use of the semiconductor film 210, whereby a semiconductor device can be manufactured. According to one embodiment of the present invention, an SOI substrate including a semiconductor film with high planarity and high crystallinity can be provided without using a laser light irradiation apparatus that can control an atmosphere at high level. In addition, a method for manufacturing a semiconductor device whose variation in characteristics is reduced and which includes a semiconductor element with favorable characteristics can be provided without using a laser light irradiation apparatus that can control an atmosphere at high level.

One embodiment of the present invention can be applied to manufacture of any kind of semiconductor devices including microprocessors, integrated circuits such as image processing circuits, RF tags for transmitting and receiving data to/from an interrogator without contact, and semiconductor display devices. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

This embodiment can be implemented in combination with any of the above embodiments.

Embodiment 4

This embodiment describes a method for manufacturing a thin film transistor, one of semiconductor elements, as an example of a method for manufacturing a semiconductor device with use of a base substrate to which a semiconductor film is attached, a so-called SOI substrate. By combining a plurality of thin film transistors, a variety of types of semiconductor devices can be manufactured.

Figure 7A:
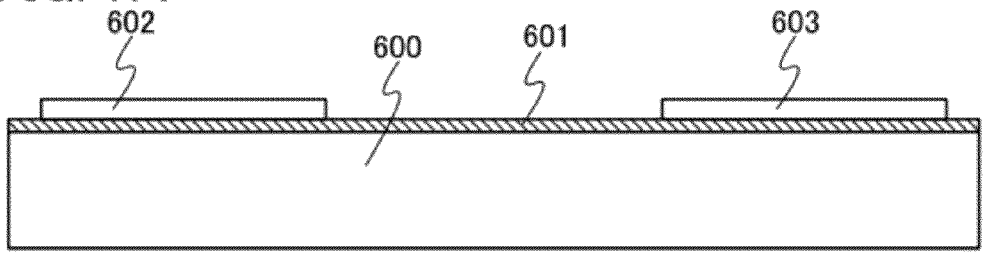
FIGS. 7A to 7D are diagrams illustrating a manufacturing method according to one embodiment of the present invention.

First, as illustrated in FIG. 7A, island-shaped semiconductor films 602 and 603 are formed over a base substrate 600 with an insulating film 601 sandwiched therebetween.

In order to control threshold voltage, a p-type impurity such as boron, aluminum, or gallium or an n-type impurity such as phosphorus or arsenic may be added to the semiconductor films 602 and 603. For example, in the case of adding boron as an impurity imparting p-type conductivity, boron may be added at a concentration of greater than or equal to $5 \times 10^{16}$ cm$^{-3}$ and less than or equal to $1 \times 10^{17}$ cm$^{-3}$. The addition of the impurity for controlling the threshold voltage may be performed on a semiconductor film before being patterned or may be performed on the semiconductor films 602 and 603 which are formed after the patterning. Alternatively, the impurity for controlling the threshold voltage may be added to a bond substrate. Alternatively, the addition of the impurity may be performed on the bond substrate in order to roughly control the threshold voltage, and the addition of the impurity may be further performed on the semiconductor film before being patterned or the semiconductor films 602 and 603 which are formed after the patterning in order to finely control the threshold voltage.

Hydrogenation may be performed after the semiconductor films 602 and 603 are formed and before gate insulating films 604 are formed. Hydrogenation is performed, for example, at 350° C. for about 2 hours in a hydrogen atmosphere.

Figure 7B:
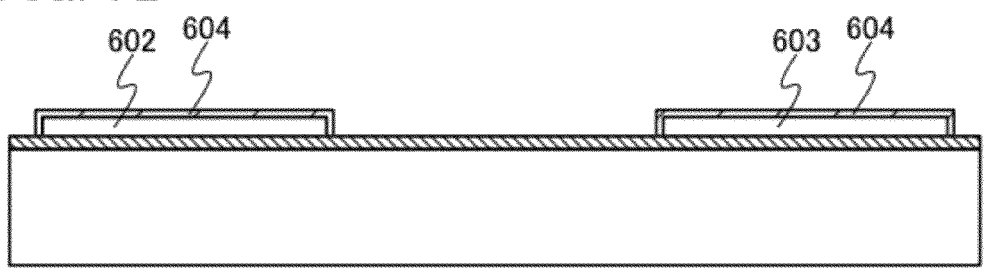

Next, as shown in FIG. 7B, the gate insulating films 604 are formed so as to cover the semiconductor films 602 and 603. Surfaces of the semiconductor films 602 and 603 may be oxidized or nitrided by high-density plasma treatment, so that the gate insulating films 604 can be formed. The high-density plasma treatment is performed using a mixed gas of a rare gas such as He, Ar, Kr, or Xe and any of oxygen, nitrogen oxide, ammonia, nitrogen, hydrogen, or the like. When plasma excitation is performed by introduction of microwaves, plasma with a low electron temperature and high density can be generated. The surfaces of the semiconductor films are oxidized or nitrided by oxygen radicals (which include OH radicals in some cases) or nitrogen radicals (which include NH radicals in some cases) produced by such high-density plasma, whereby an insulating film with a thickness of 1 nm to 20 nm, desirably 5 nm to 10 nm, is formed in contact with the semiconductor films. The insulating film with a thickness of 5 nm to 10 nm is used as the gate insulating films 604. For example, dinitrogen monoxide ($N_2O$) is diluted with Ar by 1 to 3 times (flow rate ratio) and a microwave (2.45 GHz) electric power of 3 kW to 5 kW is applied with a pressure of 10 Pa to 30 Pa to oxidize or nitride the surfaces of the semiconductor films 602 and 603. By this process, an insulating film with a thickness of 1 nm to 10 nm (preferably 2 nm to 6 nm) is formed. Moreover, dinitrogen monoxide ($N_2O$) and silane ($SiH_4$) are introduced and a microwave (2.45 GHz) electric power of 3 kW to 5 kW is applied with a pressure of 10 Pa to 30 Pa to form a silicon oxynitride film by a vapor deposition method, thereby forming a gate insulating film.

With a combination of a solid-phase reaction and a reaction by a vapor deposition method, the gate insulating film with low interface state density and excellent withstand voltage can be formed.

Since the oxidation or nitridation of the semiconductor films by the high-density plasma treatment is a solid-phase reaction, the interface state density between the gate insulating film 604 and each of the semiconductor films 602 and 603 can be drastically decreased. Further, since the semiconductor films 602 and 603 are directly oxidized or nitrided by the high-density plasma treatment, variation in thickness of the insulating film to be formed can be suppressed. Moreover, in the case where the semiconductor films have crystallinity, the surfaces of the semiconductor films are oxidized by the solid state reaction through the high-density plasma treatment, whereby rapid oxidation only at crystal grain boundaries can be suppressed and the gate insulating film with favorable uniformity and low interface state density can be formed. A transistor in which the insulating film formed by the high-density plasma treatment is used as part of the gate insulating film or as the whole gate insulating film can have less variation in characteristics.

Alternatively, the gate insulating films 604 may be formed by thermally oxidizing the semiconductor films 602 and 603. The gate insulating films 604 may be formed of a single layer or stacked layers of a film including silicon oxide, silicon nitride oxide, silicon oxynitride, silicon nitride, hafnium oxide, aluminum oxide, or tantalum oxide, by a plasma CVD method, a sputtering method, or the like.

Alternatively, heat treatment may be performed at greater than or equal to 350° C. and less than or equal to 450° C. after the formation of the gate insulating films 604 including hydrogen, whereby hydrogen in the gate insulating films 604 diffuses to the semiconductor films 602 and 603. In this case, the gate insulating films 604 may be formed by depositing silicon nitride or silicon nitride oxide by a plasma CVD method at a process temperature of 350° C. or lower. By supplying hydrogen to the semiconductor films 602 and 603, defects which serve as trapping centers in the semiconductor films 602 and 603 and at an interface between the gate insulating film 604 and each of the semiconductor films 602 and 603 can be decreased.

Figure 7C:
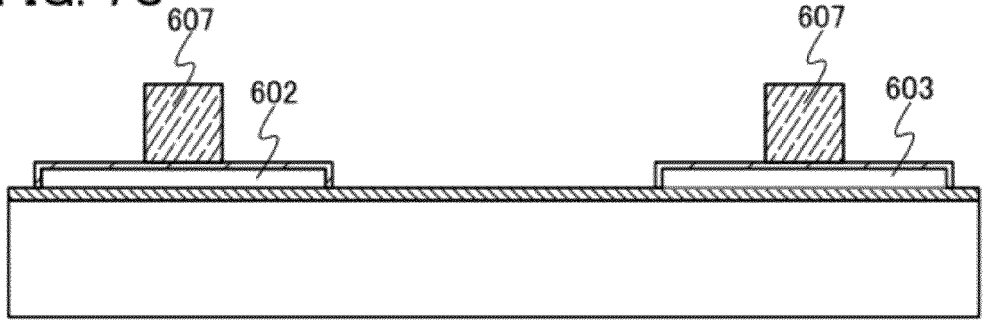

Next, a conductive film is formed over the gate insulating films 604, and then the conductive film is processed (patterned) into predetermined shapes, whereby electrodes 607 are formed over the semiconductor films 602 and 603 as illustrated in FIG. 7C. A CVD method, a sputtering method, or the like can be used for forming the conductive film. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing the above-described metal as a main component or a compound containing the above-described metal can also be used. Alternatively, the conductive film may be formed of a semiconductor such as polycrystalline silicon obtained by doping a semiconductor film with an impurity element such as phosphorus which imparts conductivity.

In the case of employing a two-layer structure, tantalum nitride or tantalum (Ta) can be used for a first layer and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two layers of the conductive film are formed. In addition, as a combination of the two layers of the conductive film, for example, nickel silicide and silicon doped with an impurity which imparts n-type conductivity, WSix and silicon doped with an impurity which imparts n-type conductivity, or the like may be used.

Although the electrodes 607 are formed by a single-layer conductive film in this embodiment, this embodiment is not limited to this structure. The electrodes 607 may be formed by stacking plural conductive films. In the case of employing a three-layer structure in which more than three conductive films are stacked, a stacked structure of a molybdenum film, an aluminum film, and a molybdenum film is preferable.

As a mask used for forming the electrodes 607, silicon oxide, silicon nitride oxide, or the like may be used instead of resist. Although, in this case, a step of forming the mask made of silicon oxide, silicon nitride oxide, or the like by patterning is added, the decrease in film thickness at the time of etching is less than that in the case of using a resist mask; accordingly, the electrodes 607 each having a desired width can be formed. Alternatively, the electrodes 607 may be formed selectively by a droplet discharge method without using the mask.

Note that a droplet discharge method means a method in which droplets containing a predetermined composition are discharged or ejected from fine pores to form a predetermined pattern, and includes an inkjet method and the like.

The electrodes 607 can be formed in such a manner that the conductive film is etched into desired tapered shapes by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. Further, angles and the like of the tapered shapes can also be controlled by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 7D:
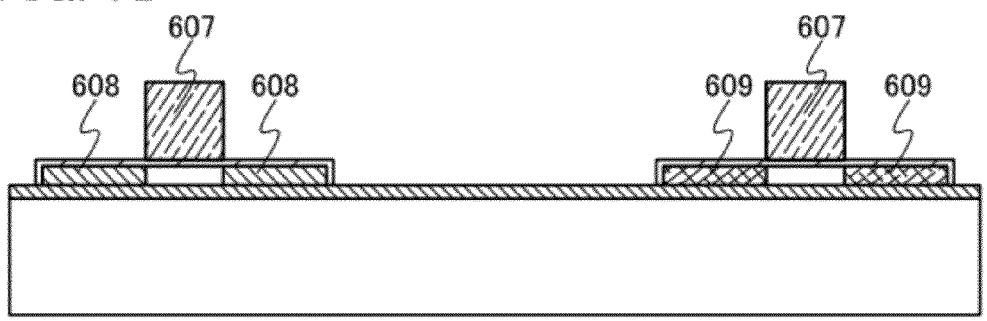

Subsequently, as shown in FIG. 7D, impurity elements imparting one conductivity type are added to the semiconductor films 602 and 603 by using the electrodes 607 as masks. In this embodiment, an impurity element imparting n-type conductivity (e.g., phosphorus or arsenic) is added to the semiconductor film 602, and an impurity element imparting p-type conductivity (e.g., boron) is added to the semiconductor film 603. Note that when the p-type impurity element is added to the semiconductor film 603, the semiconductor film 602 to which the n-type impurity element is added is covered with a mask or the like so that the p-type impurity element is added selectively. On the other hand, when the n-type impurity element is added to the semiconductor film 602, the semiconductor film 603 to which the p-type impurity element is added is covered with a mask or the like so that the n-type impurity element is added selectively. Alternatively, after adding an impurity element imparting one of p-type and n-type conductivity to the semiconductor films 602 and 603, an impurity element imparting the other conductivity may be added to only one of the semiconductor films 602 and 603 selectively at higher concentration than the previously added impurity. By the addition of the impurity elements, impurity regions 608 are formed in the semiconductor film 602 and impurity regions 609 are formed in the semiconductor film 603.

Figure 8A:
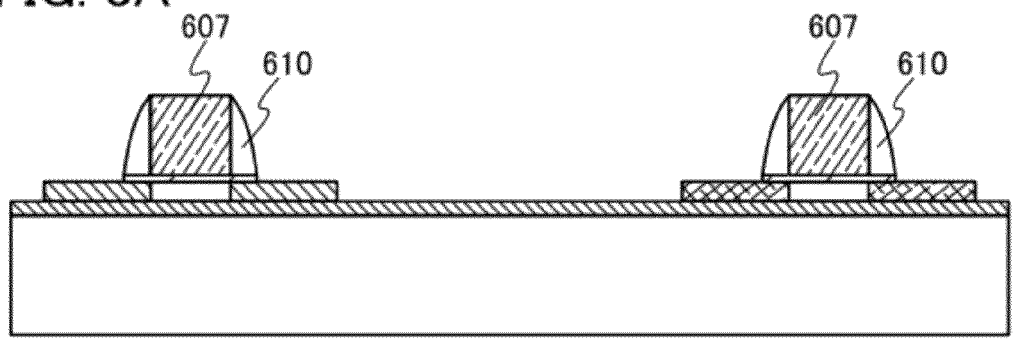
FIGS. 8A to 8C are diagrams illustrating a manufacturing method according to one embodiment of the present invention.

Subsequently, as shown in FIG. 8A, sidewalls 610 are formed at side surfaces of the electrodes 607. For example, the sidewalls 610 can be formed in such a manner that an insulating film is newly formed so as to cover the gate insulating films 604 and the electrodes 607, and the newly formed insulating film is partly etched by anisotropic etching by which etching is performed mainly in a perpendicular direction. By the anisotropic etching, the newly formed insulating film is partly etched to form the sidewalls 610 at the side surfaces of the electrodes 607. Note that the gate insulating films 604 may also be etched partly by the anisotropic etching. The insulating film for forming the sidewalls 610 may be a single layer or a stack of layers of a silicon film, a silicon oxide film, a silicon oxynitride film, or a silicon nitride oxide film formed by a plasma CVD method, a sputtering method, or the like, or a film containing an organic material such as an organic resin. In this embodiment mode, a silicon oxide film of 100 nm thick is formed by a plasma CVD method. In addition, as an etching gas, a mixed gas of $CHF_3$ and helium can be used. Note that the steps of forming the sidewalls 610 are not limited to these.

Figure 8B:
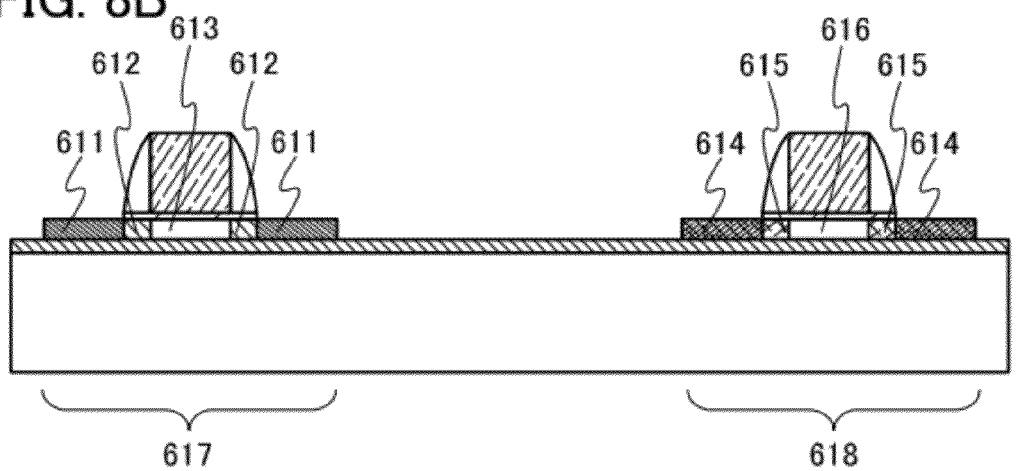

Next, as illustrated in FIG. 8B, an impurity element imparting one conductivity type is added to the semiconductor films 602 and 603 with the use of the electrodes 607 and the sidewalls 610 as masks. Note that the impurity element imparting the same conductivity type as the impurity element which has been added to the semiconductor films 602 and 603 in the previous step is added to the semiconductor films 602 and 603 at higher concentrations than that in the previous step. Note that when the p-type impurity element is added to the semiconductor film 603, the semiconductor film 602 to which the n-type impurity element is added is covered with a mask or the like so that the p-type impurity element is added selectively. On the other hand, when the n-type impurity element is added to the semiconductor film 602, the semiconductor film 603 to which the p-type impurity element is added is covered with a mask or the like so that the n-type impurity element is added selectively.

By the above-described addition of the impurity element, a pair of high-concentration impurity regions 611, a pair of low-concentration impurity regions 612, and a channel formation region 613 are formed in the semiconductor film 602. In addition, by the above-described addition of the impurity element, a pair of high-concentration impurity regions 614, a pair of low-concentration impurity regions 615, and a channel formation region 616 are formed in the semiconductor film 603. The high-concentration impurity regions 611 and 614 function as sources and drains, and the low-concentration impurity regions 612 and 615 function as LDD (lightly doped drain) regions.

Note that the sidewalls 610 formed over the semiconductor film 603 and the sidewalls 610 formed over the semiconductor film 602 may have either the same or different width in a direction where carriers move. The width of each sidewall 610 over the semiconductor film 603 which forms a p-channel transistor is preferably larger than that over the semiconductor film 602 which forms an n-channel transistor. This is because boron which is added for forming the source and the drain of the p-channel transistor easily diffuses so that a short channel effect is easily induced. When the width of the sidewall 610 of the p-channel transistor is made larger, boron can be added to the source and the drain at high concentration, and thus the resistance of the source and the drain can be decreased.

Next, a silicide layer may be formed by siliciding the semiconductor films 602 and 603 in order to further decrease the resistance of the sources and the drains. The siliciding is performed in such a manner that a metal is brought into contact with the semiconductor films, and silicon in the semiconductor films is made to react with the metal by heat treatment such as a GRTA method or an LRTA method. Cobalt silicide or nickel silicide may be used as the silicide layer. In a case where the semiconductor films 602 and 603 are thin, the siliciding may be continued to the bottom of the semiconductor films 602 and 603 in this region. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, the silicide layer may be formed by laser irradiation or light irradiation using a lamp or the like.

Through the above-described series of steps, an n-channel transistor 617 and a p-channel transistor 618 are formed.

Figure 8C:
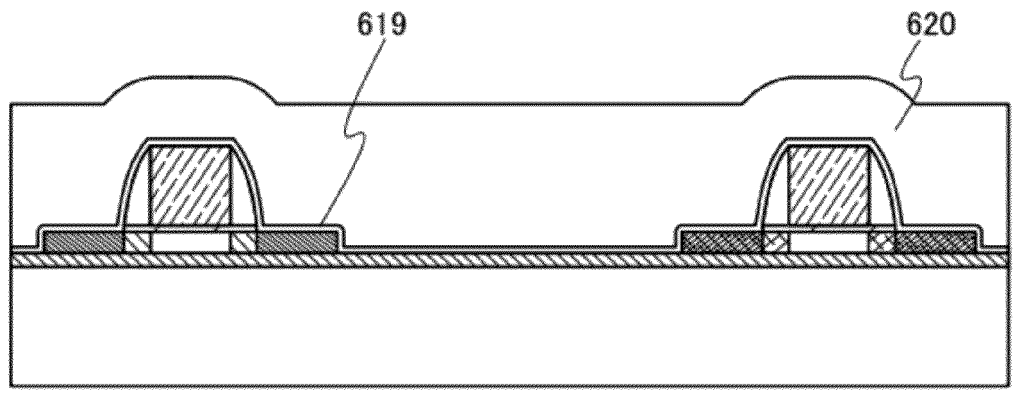

Next, an insulating film 619 is formed so as to cover the transistors 617 and 618, as shown in FIG. 8C. The insulating film 619 is not always necessary; however, the formation of the insulating film 619 can prevent impurities such as an alkali metal and an alkaline earth metal from entering the transistors 617 and 618. Specifically, it is desirable to use silicon nitride, silicon nitride oxide, silicon oxynitride, aluminum nitride, aluminum oxide, silicon oxide, or the like for the insulating film 619. In this embodiment, the insulating film 619 is formed using a silicon nitride oxide film with a thickness of about 600 nm. In this case, the hydrogenation treatment described above may be performed after formation of the silicon nitride oxide film.

Next, an insulating film 620 is formed over the insulating film 619 so as to cover the transistors 617 and 618. An organic material having heat resistance, such as polyimide, an acrylic resin, benzocyclobutene, polyamide, or an epoxy resin can be used for the insulating film 620. Other than such organic materials, it is also possible to use a low-dielectric constant material (a low-k material), a siloxane-based resin, silicon oxide, silicon nitride, silicon nitride oxide, PSG (phosphosilicate glass), BPSG (borophosphosilicate glass), alumina, or the like. A siloxane-based resin may contain at least one of fluorine, an alkyl group, and aromatic hydrocarbon besides hydrogen as a substituent. Alternatively, the insulating film 620 may be formed by stacking plural insulating films formed of these materials. The insulating film 620 may have its surface planarized by a CMP method or the like.

Note that the siloxane-based resin corresponds to a resin including a Si—O—Si bond formed using a siloxane-based material as a starting material. The siloxane-based resin may have at least one of fluorine, an alkyl group, and aromatic hydrocarbon besides hydrogen as a substituent.

There is no particular limitation on the method for forming the insulating film 620, and the insulating film 620 can be formed, depending on the material, by a method such as a CVD method, a sputtering method, an SOG method, spin coating, dipping, spray coating, or a droplet discharge method (e.g., an inkjet method, screen printing, or offset printing), or with a tool (equipment) such as a doctor knife, a roll coater, a curtain coater, or a knife coater.

Figure 9:
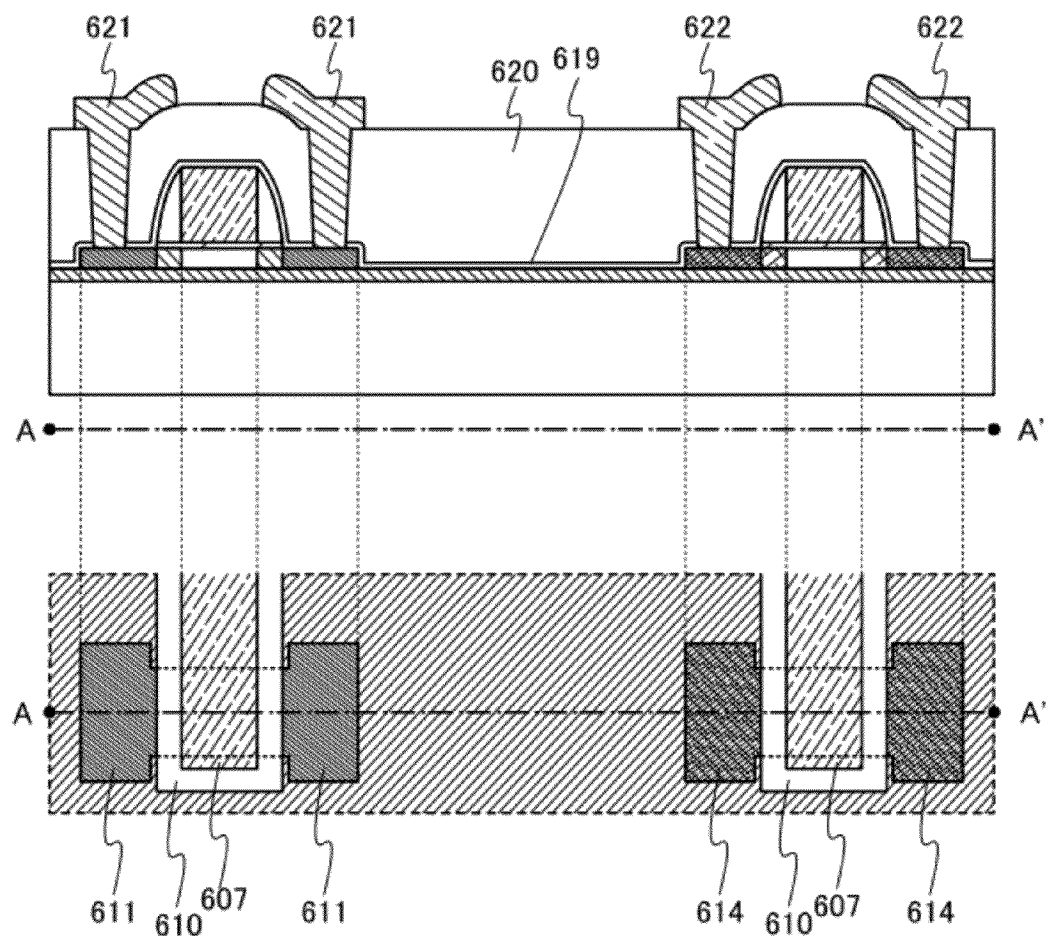
FIG. 9 is a diagram illustrating a manufacturing method according to one embodiment of the present invention.

Next, as illustrated in FIG. 9, contact holes are formed in the insulating film 619 and the insulating film 620 so that the semiconductor films 602 and 603 are partly exposed. Then, conductive films 621 and 622 are formed in contact with the semiconductor films 602 and 603, respectively through the contact holes. As an etching gas for forming the contact holes, a mixed gas of $CHF_3$ and He is employed, though the present invention is not limited to this.

The conductive films 621 and 622 can be formed by a CVD method, a sputtering method, or the like. Specifically, the conductive films 621 and 622 can be formed of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 621 and 622 can be formed as a single layer or a stack of plural layers by using a film formed of any of the aforementioned metals.

Examples of an alloy containing aluminum as its main component include an alloy containing aluminum as its main component and also containing nickel. In addition, an alloy containing aluminum as its main component and also containing nickel and one of or both carbon and silicon can also be given as the example thereof. Since aluminum and aluminum silicon have low resistance values and are inexpensive, aluminum and aluminum silicon are suitable for forming the conductive films 621 and 622. In comparison to an aluminum film, an aluminum silicon film can particularly prevent the generation of a hillock during resist baking at the time of patterning the conductive films 621 and 622. Cu may be mixed by approximately 0.5% into an aluminum film instead of silicon (Si).

The conductive films 621 and 622 preferably employ, for example, a stacked-layer structure of a barrier film, an aluminum silicon (Al—Si) film, and a barrier film, or a stacked-layer structure of a barrier film, an aluminum silicon (Al—Si) film, a titanium nitride film, and a barrier film. Note that the barrier film refers to a film formed using titanium, a nitride of titanium, molybdenum, or a nitride of molybdenum. When barrier films are formed with an aluminum silicon film interposed therebetween, generation of a hillock of aluminum or aluminum silicon can be further prevented. Moreover, when the barrier film is formed of titanium which is a highly-reducible element, even if a thin oxide film is formed over the semiconductor films 602 and 603, the oxide film is reduced by titanium contained in the barrier film, whereby preferable contact between the conductive films 621 and 622 and the semiconductor films 602 and 603 can be obtained. Further, it is also possible to stack a plurality of barrier films. In that case, for example, a five-layer structure in which titanium, titanium nitride, aluminum silicon, titanium, and titanium nitride are stacked from the bottom can be used for the conductive films 621 and 622.

The conductive films 621 and 622 may be formed of tungsten silicide with use of a $WF_6$ gas and a $SiH_4$ gas by a chemical vapor deposition method. Alternatively, the conductive films 621 and 622 may be formed of tungsten obtained by hydrogen reduction of $WF_6$.

Note that the conductive films 621 are connected to the high-concentration impurity regions 611 of the n-channel transistor 617. The conductive films 622 are connected to the high-concentration impurity regions 614 of the p-channel transistor 618.

FIG. 9 also illustrates a top view of the n-channel transistor 617 and the p-channel transistor 618. Note that the conductive films 621 and 622, the insulating film 619, and the insulating film 620 are omitted in this top view.

In addition, although the case where each of the n-channel transistor 617 and the p-channel transistor 618 includes one electrode 607 functioning as the gate is shown as an example in this embodiment, the present invention is not limited to this structure. The transistor included in the semiconductor device formed by the manufacturing method of the present invention may have a multigate structure in which a plurality of electrodes functioning as gates are electrically connected to one another.

Moreover, the transistor included in the semiconductor device formed by the manufacturing method of the present invention may have a gate planar structure.

Note that the semiconductor film of the SOI substrate has a substantially single-crystal structure. Therefore, variation in orientation is small as compared with that in the case of a polycrystalline semiconductor film; accordingly, variation in threshold voltage of transistors can be decreased. Moreover, since crystal grain boundaries in the semiconductor film of the SOI substrate are much smaller than those in a polycrystalline semiconductor film, it is possible to suppress leakage current caused by the crystal grain boundaries and to achieve reduction in power consumption of a semiconductor device. In a polycrystalline semiconductor film obtained by laser crystallization, a surface of the semiconductor film tends to have projections (ridges) in reflection of distribution of energy density of a beam spot. In contrast, the semiconductor film may be irradiated with laser light of low energy density to such a degree that defects in the semiconductor film caused by the bonding step can be repaired. Accordingly, the semiconductor film of the SOI substrate has a much flatter surface than the polycrystalline semiconductor film obtained by laser crystallization and the gate insulating film formed over the semiconductor film of the SOI substrate can therefore has a thickness as small as 5 nm to 50 nm. Thus, high on-current can be obtained while suppressing gate voltage. In the case of using a polycrystalline semiconductor film obtained by laser crystallization, it is necessary to arrange the semiconductor films of transistors along a scanning direction of laser light, in order to achieve higher mobility. However, the semiconductor film of the SOI substrate is not restricted in arrangement; therefore, limit on design of semiconductor devices is reduced.

This embodiment can be implemented in combination with any of the above embodiments as appropriate.

Embodiment 5

Figure 10:
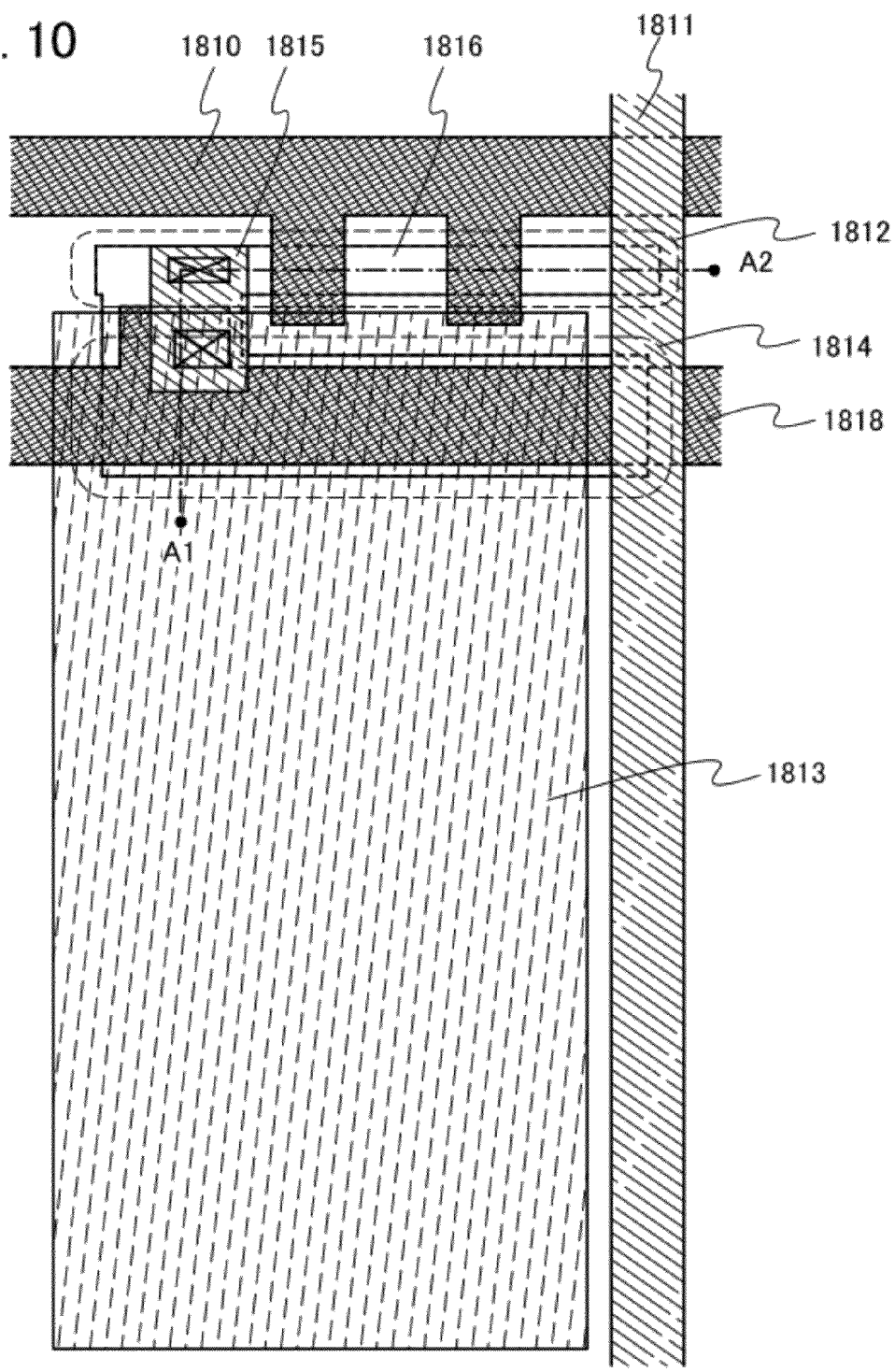
FIG. 10 is a top view of a pixel of a liquid crystal display device formed using a manufacturing method according to one embodiment of the present invention.
Figure 11:
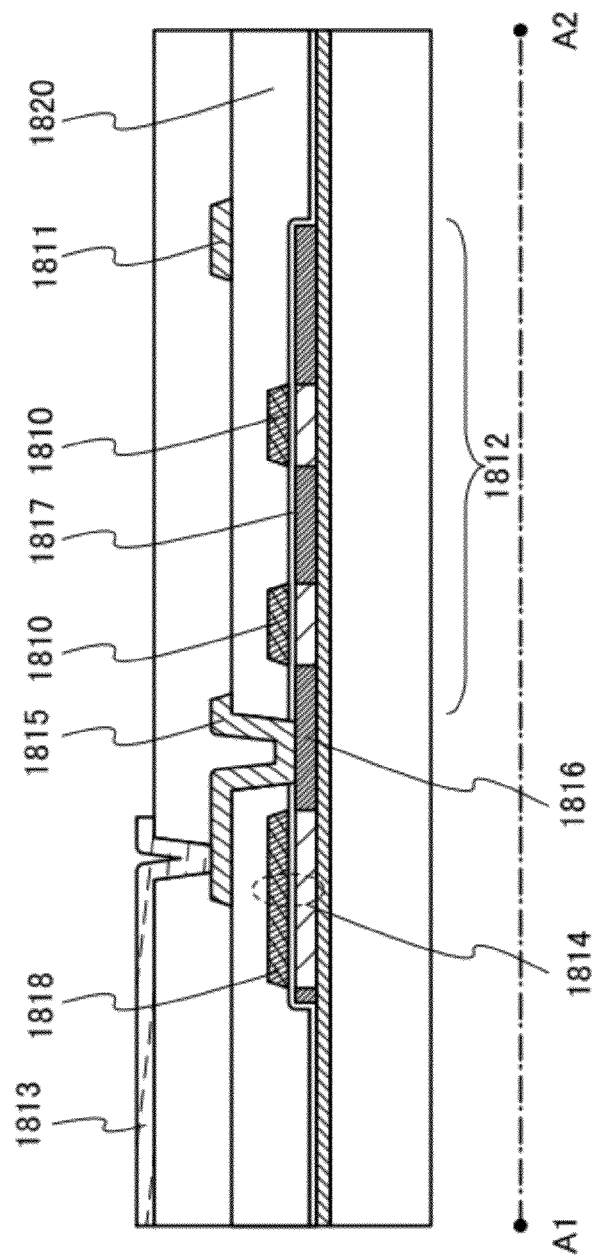
FIG. 11 is a cross-sectional view of a pixel of a liquid crystal display device formed using a manufacturing method according to one embodiment of the present invention.

In this embodiment, a specific structure of a pixel in a liquid crystal display device which is formed by a method for manufacturing a semiconductor device of the present invention will be described. FIG. 10 illustrates an example of a top view of a pixel in a liquid crystal display device. FIG. 11 corresponds to a cross-sectional view taken along dashed line A1-A2 of the top view in FIG. 10.

The pixel illustrated in FIG. 10 and FIG. 11 includes at least a scanning line 1810, a signal line 1811, a transistor 1812 functioning as a switching element, a pixel electrode 1813, and a storage capacitor 1814 for storing voltage applied to a liquid crystal element. In addition, the pixel illustrated in FIG. 10 and FIG. 11 includes a wiring 1815 for electrically connecting the pixel electrode 1813, and the transistor 1812 and the storage capacitor 1814.

The transistor 1812 and the storage capacitor 1814 share a semiconductor film 1816. The semiconductor film 1816 can be formed in the following manner: a semiconductor film is formed by a method for manufacturing an SOI substrate according to one embodiment of the present invention; and then, the semiconductor film is processed (patterned) into a desired shape.

An insulating film 1817 is formed over the semiconductor film 1816, and a conductive film 1818 and the scanning line 1810 are formed over the insulating film 1817. The conductive film 1818 and the scanning line 1810 can be formed in such a manner that a conductive film formed over the insulating film 1817 is processed into a desired shape. Note that part of the scanning line 1810 functions as a gate electrode of the transistor 1812, and overlaps with the semiconductor film 1816. A portion where the conductive film 1818 overlaps with the semiconductor film 1816 with the insulating film 1817 sandwiched therebetween corresponds to the storage capacitor 1814.

The wiring 1815 and the signal line 1811 can be formed in the following manner: a conductive film is formed over an interlayer insulating film 1820 covering the storage capacitor 1814 and the transistor 1812; and then, the conductive film is processed into a desired shape.

Since the semiconductor film 1816 is formed by a method for manufacturing an SOI substrate according to one embodiment of the present invention, the semiconductor film 1816 has favorable crystallinity. Therefore, mobility of the transistor 1812 is increased, and on-current can be increased. In addition, since the semiconductor film 1816 is formed by a method for manufacturing an SOI substrate according to one embodiment of the present invention, the semiconductor film 1816 has high planarity. Therefore, decrease in withstand voltage due to, for example, reduction in thickness of part of the insulating film 1817 functioning as a gate insulating film of the transistor 1812 which is caused by unevenness of the semiconductor film 1816 can be prevented. As a result, the thickness of the gate insulating film can be reduced. Therefore, miniaturization of an element can be realized.

This embodiment can be implemented in combination with any of the above embodiments as appropriate.

Embodiment 6

In this embodiment, a procedure in the case of forming a plurality of semiconductor devices with the use of one base substrate will be described.

Figure 12A:
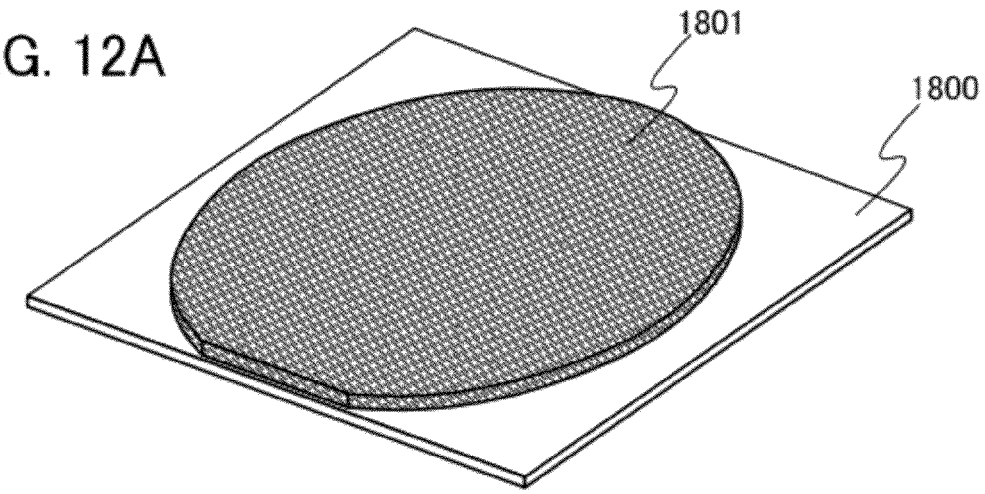
FIGS. 12A and 12B are diagrams illustrating a manufacturing method according to one embodiment of the present invention.

FIG. 12A is a perspective view in which a bond substrate 1801 is attached to a base substrate 1800. The attachment of the bond substrate 1801 to the base substrate 1800 is performed by bonding the base substrate 1800 and an insulating film formed over the bond substrate 1801 or by bonding the insulating film formed over the bond substrate 1801 and an insulating film formed over the base substrate 1800.

Figure 12B:
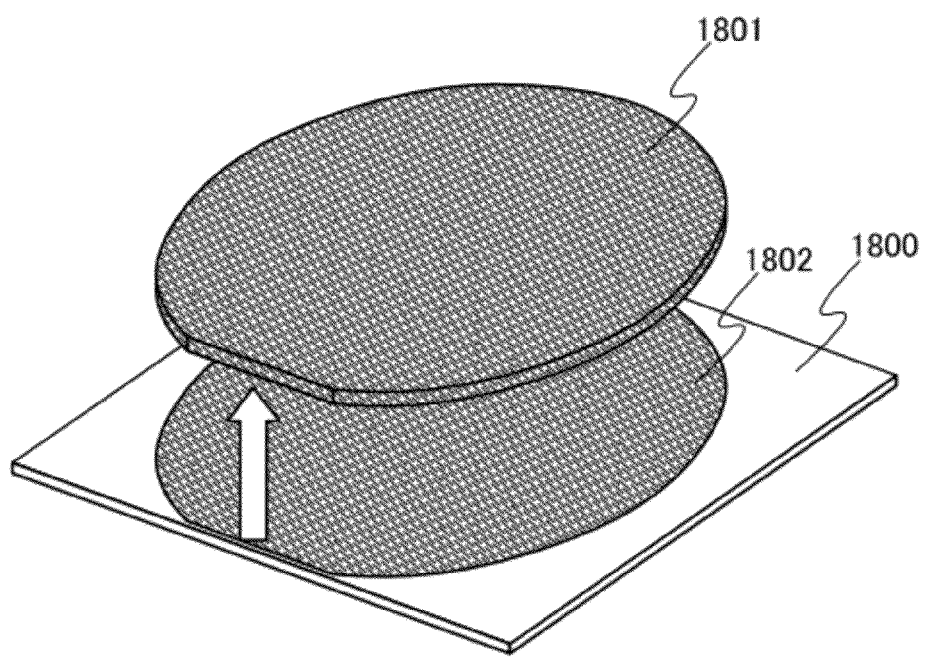

Next, as shown in FIG. 12B, the bond substrate 1801 is partly split, so that a semiconductor film 1802 which is part of the bond substrate 1801 is formed over the base substrate 1800.

Figure 13A:
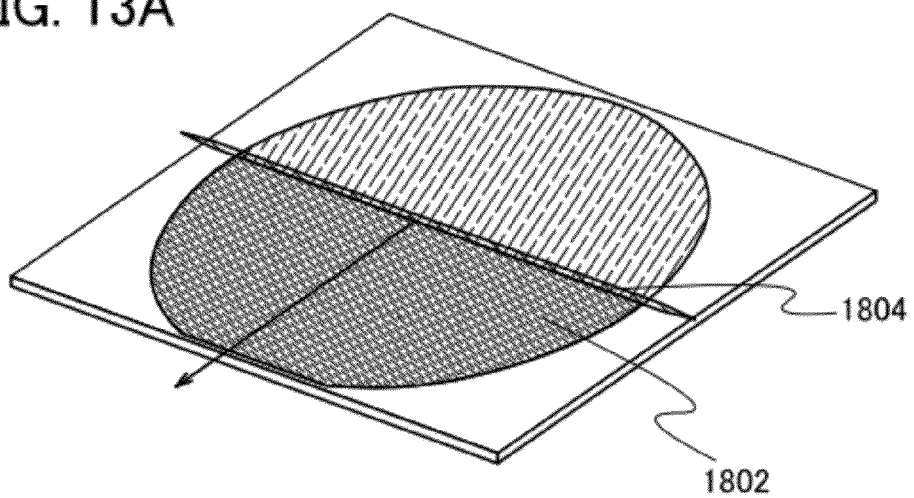
FIGS. 13A and 13B are diagrams illustrating a manufacturing method according to one embodiment of the present invention.

An oxide film such as a natural oxide film formed over the semiconductor film 1802 is removed, and then laser light irradiation is performed as shown in FIG. 13A. In one embodiment of the present invention, laser light irradiation is performed twice: in other words, first laser light irradiation and second laser light irradiation are performed. An oxide film such as a natural oxide film may be removed after the first laser light irradiation and before the second laser light irradiation. In the first laser light irradiation and the second laser light irradiation, a beam spot 1804 is scanned in a direction indicated by an arrow, whereby improvement in crystallinity and planarity is achieved.

Figure 13B:
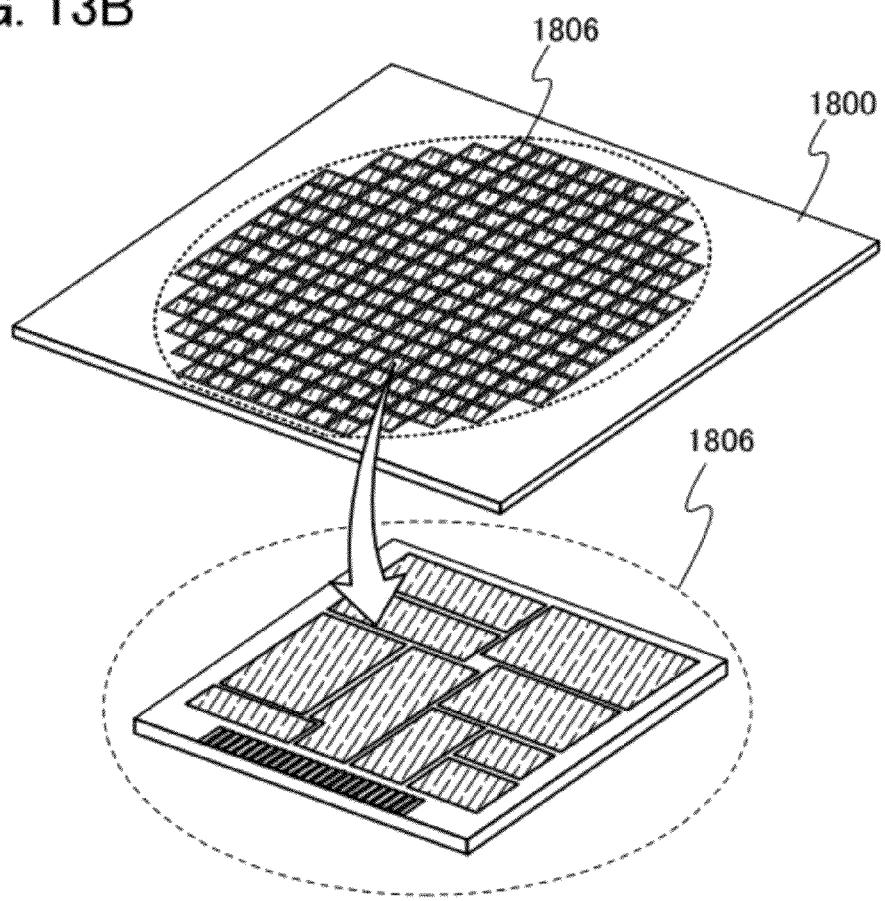

Next, as shown in FIG. 13B, a plurality of semiconductor devices 1806 are formed using the semiconductor film 1802 irradiated with the laser light in FIG. 13A, and the semiconductor devices 1806 including the base substrate 1800 are cut by dicing or the like. With the above structure, the plurality of semiconductor devices 1806 can be formed.

Although this embodiment describes the case of attaching a pair of the base substrate 1800 and the bond substrate 1801 to each other, the present invention is not limited to this structure. A plurality of bond substrates 1801 may be attached to one base substrate 1800.

This embodiment can be implemented in combination with any of the above embodiments as appropriate.

Embodiment 7

In this embodiment, improvement in planarity of a semiconductor film included in an SOI substrate with use of a method for manufacturing an SOI substrate according to one embodiment of the present invention will be described.

Surface planarity was evaluated with measured values that are used as indexes of surface roughness and that are obtained by analysis of images observed with an atomic force microscope (such images are also referred to as AFM images). As Sample A, Sample B, and Sample C used for evaluation, an SOI substrate in which an insulating film that is a silicon oxide film of about 100 nm thick formed by thermal oxidation in an oxygen atmosphere to which a gas containing hydrogen chloride is added and a semiconductor film that is formed over the insulating film by being split from a bond substrate are formed over a glass substrate (thickness: 0.7 mm, product name: AN100) manufactured by ASAHI GLASS CO., LTD. is used. In all the samples, a surface of the semiconductor film is cleaned for about 110 seconds with use of DHF having a hydrogen fluoride concentration of 0.5 wt % before first laser light irradiation, whereby a natural oxide film formed over the semiconductor film is removed.

In all the samples, as a laser, a XeCl excimer laser (wavelength: 308 nm, pulse width: 20 nanoseconds, and repetition rate: 30 Hz) was used for the first laser light irradiation. In addition, the first laser light irradiation was performed with a nitrogen gas blown on the samples at room temperature, a scanning speed of 0.5 mm/s, and a beam shot number of about 24.

As in the first laser light irradiation, in all the samples, a XeCl excimer laser (wavelength: 308 nm, pulse width: 20 nanoseconds, and repetition rate: 30 Hz) was used as a laser for the second laser light irradiation. In addition, the second laser light irradiation was performed with a nitrogen gas blown on the samples at room temperature and a beam shot number of about one.

In all the samples, the second laser light irradiation was performed so that the energy densities of the second laser light were 60%, 65%, 70%, 72%, 74%, 76%, 78%, 80%, 82%, 84%, 86%, 88%, 90%, 95%, and 100% when the energy density of the first laser light was assumed to be 100%.

Note that the energy densities of the first laser light were set to such energy densities that the objects are almost completely melted. Such energy densities that the objects are almost completely melted differ depending on the thicknesses of the semiconductor films or the like; therefore, the energy densities of the first laser light were changed depending on the samples, and cross sections of semiconductor films after the laser light irradiation under the respective conditions were observed with use of STEM (scanning transmission electron microscopy). Then, such energy densities that the objects are almost completely melted were figured out with use of STEM images, and were used for the first laser light in the samples.

Specifically, in Sample A, a semiconductor film which has a thickness of about 146 nm and has been separated from a single crystal silicon substrate whose plane orientation is (100) is used. The energy density of the first laser light was set to about 582.7 mJ/cm$^2$ in consideration of the thickness. After the first laser light irradiation, the second laser light irradiation was performed without removal of an oxide film being performed.

In Sample B, a semiconductor film which has a thickness of about 138 nm and has been separated from a single crystal silicon substrate whose plane orientation is (110) is used. The energy density of the first laser light was set to about 552.9 mJ/cm$^2$ in consideration of the thickness. After the first laser light irradiation, the second laser light irradiation was performed without removal of an oxide film being performed.

In Sample C, a semiconductor film which has a thickness of about 146 nm and has been separated from a single crystal silicon substrate whose plane orientation is (100) is used. The energy density of the first laser light was set to about 582.7 mJ/cm$^2$ in consideration of the thickness. After the first laser light irradiation, a process of removing an oxide film was performed. Then, the second laser light irradiation was performed. The process of removing the oxide film before the second laser light irradiation was performed under the same condition as the process of removing the oxide film before the first laser light irradiation.

The conditions for measurement by AFM are as follows.

Atomic force microscope (AFM): a scanning probe microscope SPI3800N/SPA500 manufactured by Seiko Instruments Inc.

Measurement mode: dynamic force mode (DFM)

Cantilever: SI-DF40 (made of silicon, a spring constant of 42 N/m, a resonant frequency of 250 kHz to 390 kHz, and a probe tip of R≦10 nm)

Measured area: 10 μm×10 μm

Measured points: 256 points×256 points

Note that DFM refers to a measurement mode in which the surface shape of a sample is evaluated in a state where a cantilever is resonated at a natural frequency while the distance between a probe provided for the cantilever and the sample is controlled so that the vibration amplitude of the cantilever is maintained constant. In DFM, the surface of the sample and the cantilever are not in contact with each other; thus, measurement is possible without changing the original shape of the surface of the sample and without damaging the surface. The surface roughness was analyzed using accessory software, so that average surface roughness $R_a$ and the maximum peak-to-valley height P-V were calculated.

Figure 17:
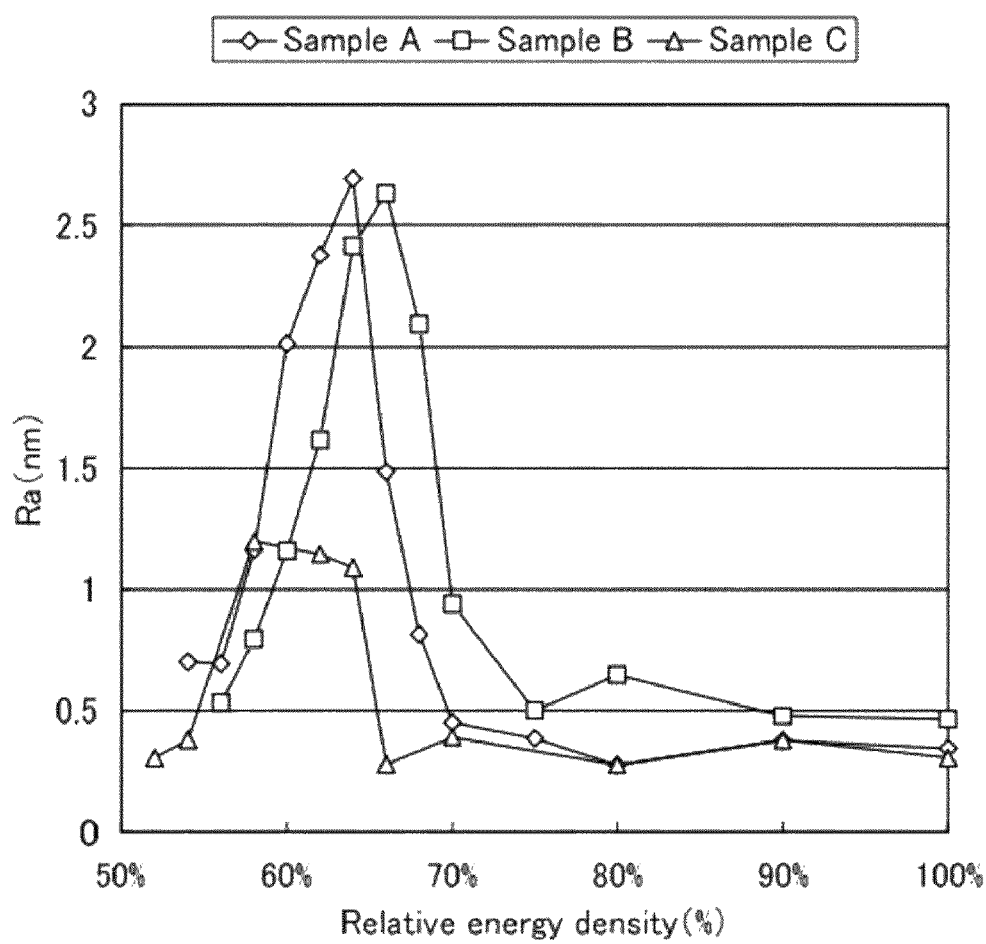
FIG. 17 is a graph showing average plane roughness $R_a$ with respect to a relative energy density.

In FIG. 17, the average surface roughness $R_a$ of the semiconductor film of each of the samples, which was calculated based on the AFM image is shown. The vertical axis indicates the average surface roughness $R_a$(nm). The horizontal axis indicates the strength of a relative energy density of the second laser light with respect to the first laser light.

As shown in FIG. 17, in each of Sample A and Sample B in which the oxide film was not removed before the second laser light irradiation, the maximum value of an average surface roughness $R_a$ of about 2.5 nm or more was shown when the relative energy density was about 60% to 70%. On the other hand, in Sample C in which the oxide film is removed before the second laser light irradiation, the maximum value of an average surface roughness $R_a$ of about 1.2 nm or more was shown when the relative energy density was about 55% to 65%. From the comparison between these maximum values of the average surface roughness $R_a$, it is found that the average surface roughness $R_a$ can be reduced and planarity can be improved when the oxide film is removed before the second laser light irradiation.

In Sample A and Sample B in which the oxide films were not removed before the second laser light irradiation, the maximum peak-to-valley height (P-V) of Sample A was about 30 nm and that of Sample B was about 32 nm. On the other hand, in Sample C in which the oxide film was removed before the second laser light irradiation, the maximum peak-to-valley height (P-V) was about 26 nm, which is lower than the values of Sample A and Sample B. Therefore, also from the comparison between these maximum peak-to-valley heights (P-V), it is found that the maximum peak-to-valley height (P-V) can be reduced and planarity can be improved when the oxide film is removed before the second laser light irradiation.

Average surface roughness ($R_a$) is obtained by expanding, into three dimensions, center line average roughness $R_a$ that is defined by JIS B 0601:2001 (ISO 4287:1997) so as to apply $R_a$ to a measurement surface. The $R_a$ is an "average value of the absolute values of deviations from a reference surface to a specific surface". The measurement surface is a surface which is shown by the all measurement data. The specific surface is a surface which is an object of roughness measurement. The reference surface is a plane surface represented by $Z=Z_0$ where $Z_0$ is the average value of the height of the specific surface. The maximum peak-to-valley height (P-V) is a difference between the height of the highest peak $Z_{max}$ and the height of the lowest valley $Z_{min}$ in the specific surface. The peak and the valley herein are obtained by expanding into three dimensions the "peak" and the "valley" that are defined by JIS B 0601:2001 (ISO 4287:1997). The peak can be expressed as the highest point in the specific surface and the valley can be expressed as the lowest point in the specific surface.

Figure 18A:
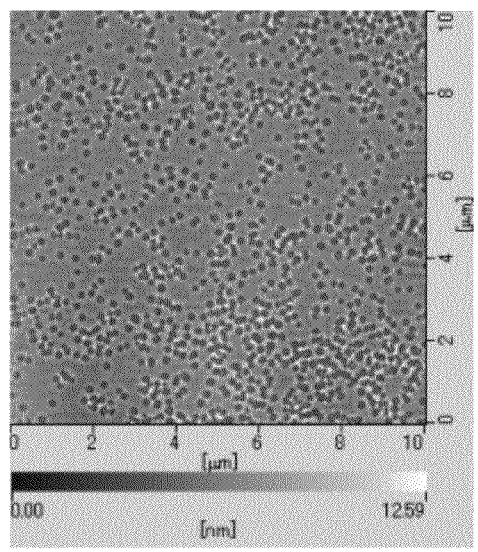
FIGS. 18A to 18C are AFM images of semiconductor films after laser light irradiation.
Figure 18B:
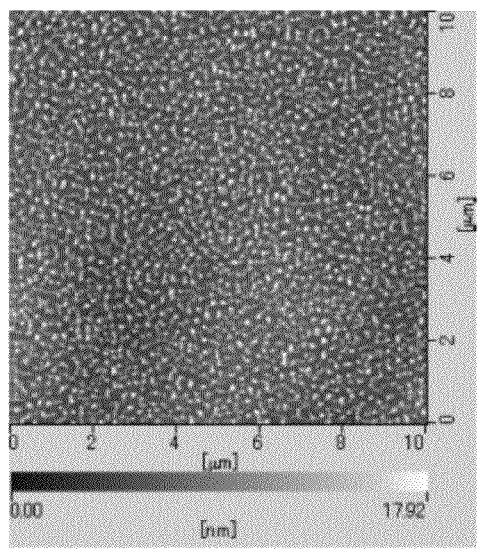
Figure 18C:
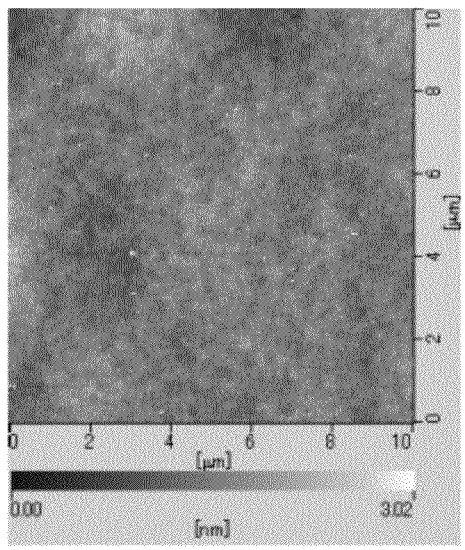

Next, AFM images of the above samples are shown in FIGS. 18A to 18C. FIG. 18A is an AFM image of the surface of the semiconductor film in Sample A in the case where the relative energy density of the second laser light is about 66%. FIG. 18B is an AFM image of the surface of the semiconductor film in Sample B in the case where the relative energy density of the second laser light is about 66%. FIG. 18C is an AFM image of the surface of the semiconductor film in Sample C in the case where the relative energy density of the second laser light is about 66%. From FIGS. 18A to 18C, crater-shaped unevenness is generated on the surface of the semiconductor film in each of Sample A and Sample B, but the crater-shaped unevenness is hardly seen in Sample C. In all the samples, in the case where the energy density of the second laser light is further increased from that in the above condition, the crater-shaped unevenness is reduced. Therefore, it is found from FIG. 17 and FIGS. 18A to 18C that Sample C has the widest range of the energy density of the second laser light with which the crater-shaped unevenness is prevented from being generated.

Next, a surface of a semiconductor film over an SOI substrate was observed with use of an optical microscope. As Sample 1 and Sample 2 used for observation, an SOI substrate in which an insulating film that is a silicon oxide film of about 100 nm thick formed by thermal oxidation in an oxygen atmosphere to which a gas containing hydrogen chloride is added and a semiconductor film that is formed over the insulating film by being separated from a bond substrate are formed over a glass substrate (thickness: 0.7 mm, product name: AN100) manufactured by ASAHI GLASS CO., LTD. is used. In all the samples, a surface of the semiconductor film is cleaned for about 110 seconds with use of DHF having a hydrogen fluoride concentration of 0.5 wt % before first laser light irradiation, whereby a natural oxide film formed over the semiconductor film is removed.

In Sample 1 and Sample 2, a XeCl excimer laser (wavelength: 308 nm, pulse width: 20 nanoseconds, and repetition rate: 30 Hz) was used as a laser for the first laser light irradiation. In addition, the first laser light irradiation was performed with a nitrogen gas blown on the samples at room temperature, a scanning speed of 0.5 mm/s, and a beam shot number of about 24.

As in the first laser light irradiation, in Sample 1 and Sample 2, a XeCl excimer laser (wavelength: 308 nm, pulse width: 20 nanoseconds, and repetition rate: 30 Hz) was used as a laser for the second laser light irradiation. In addition, the second laser light irradiation was performed with a nitrogen gas blown on the samples at room temperature, a scanning speed of 8.0 mm/s, and a beam shot number of about 1.5.

Specifically, in Sample 1, a semiconductor film which has a thickness of about 110 nm and has been separated from a single crystal silicon substrate whose plane orientation is (100) is used. The energy density of the first laser light and the second laser light was set to about 582.7 mJ/cm$^2$ in consideration of the thickness. After the first laser light irradiation, the second laser light irradiation was performed without removal of an oxide film being performed.

In Sample 2, a semiconductor film which has a thickness of about 110 nm and has been separated from a single crystal silicon substrate whose plane orientation is (100) is used. The energy density of the first laser light and the second laser light was set to about 582.7 mJ/cm$^2$ in consideration of the thickness. After the first laser light irradiation, a process of removing an oxide film was performed. Then, the second laser light irradiation was performed. The process of removing the oxide film before the second laser light irradiation was performed under the same condition as the process of removing the oxide film before the first laser light irradiation.

Figure 19A:
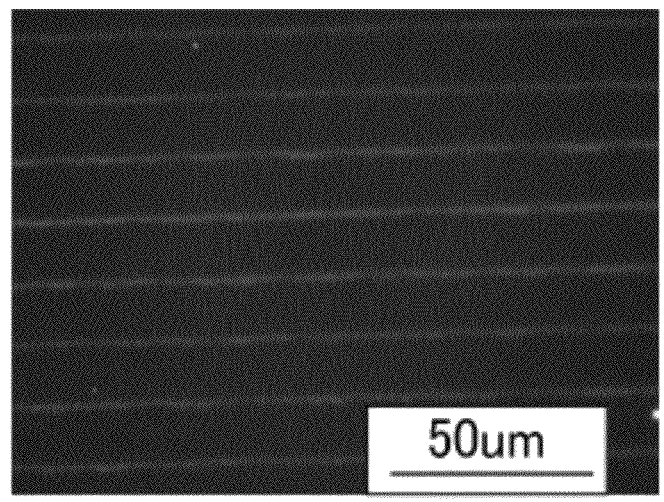
FIGS. 19A and 19B are optical micrographs of semiconductor films after laser light irradiation.
Figure 19B:
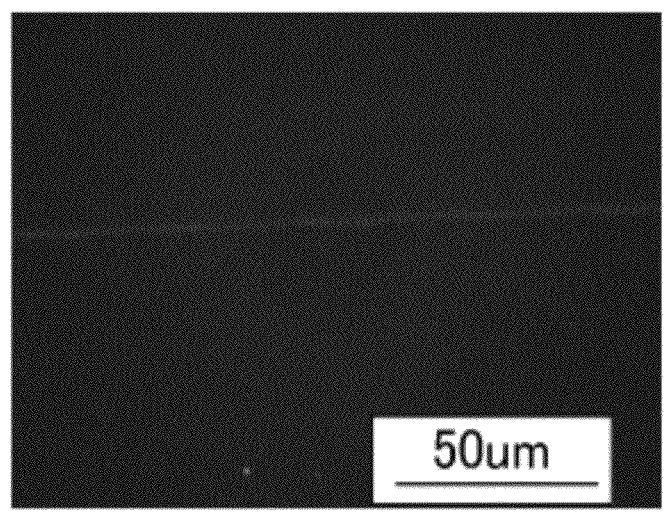

An optical micrograph of the semiconductor film of Sample 1 is shown in FIG. 19A, and an optical micrograph of the semiconductor film of Sample 2 is shown in FIG. 19B. Processing was performed on the micrographs in order to emphasize portions with pitch stripes. The number of pitch stripes in the micrograph of FIG. 19B is smaller than that in the micrograph of FIG. 19A. Therefore, it is found that Sample 2 in which the process of removing the oxide film was performed has higher planarity than Sample 1.

Embodiment 8

Figure 14A:
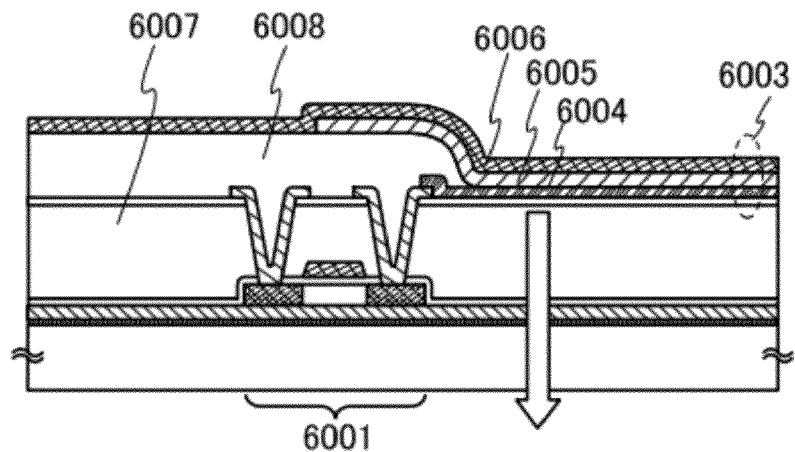
FIGS. 14A to 14C are cross-sectional views each illustrating a pixel of a light-emitting device formed using a manufacturing method according to one embodiment of the present invention.
Figure 14B:
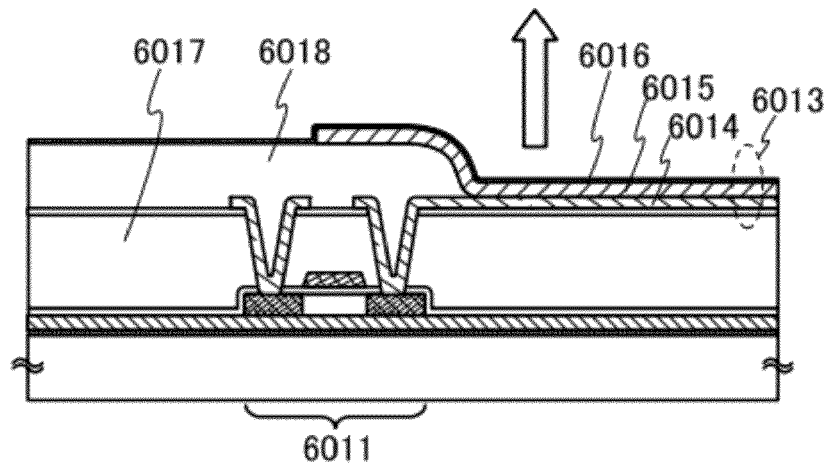
Figure 14C:
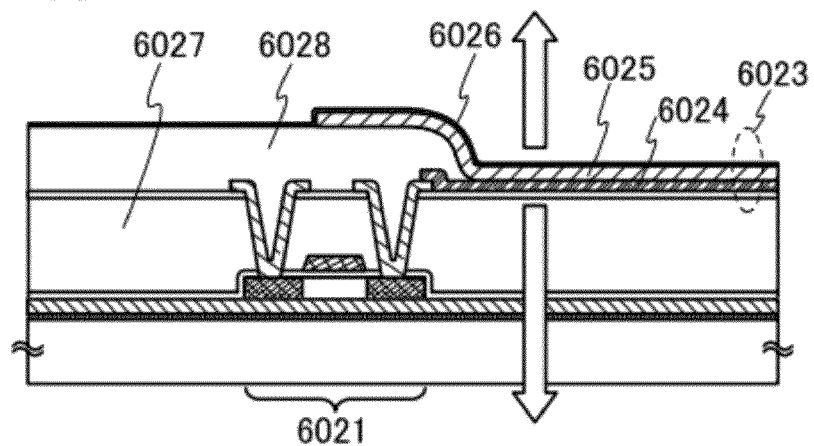

In this embodiment, a structure of a light-emitting device which is formed by a manufacturing method of a semiconductor device according to one embodiment of the present invention will be described. In FIGS. 14A to 14C, examples of a cross-sectional structure of a pixel in the case where a transistor for driving a light-emitting element is a p-channel transistor are illustrated. Note that although the case where a first electrode is an anode and a second electrode is a cathode is illustrated in FIGS. 14A to 14C, the first electrode may be a cathode and the second electrode may be an anode as well.

A cross-sectional view of a pixel in the case where a transistor 6001 is a p-channel transistor, and light emitted from a light-emitting element 6003 is extracted from a first electrode 6004 side is illustrated in FIG. 14A.

The transistor 6001 is covered with an insulating film 6007, and a bank 6008 having an opening is formed over the insulating film 6007. In the opening of the bank 6008, the first electrode 6004 is partially exposed, and the first electrode 6004, an electroluminescent layer 6005, and a second electrode 6006 are sequentially stacked in the opening.

The first electrode 6004 is formed using such a material or to such a thickness as to have a light-transmitting property with respect to visible light, and is formed using a material suitable for being used as an anode. For example, the first electrode 6004 can be formed using a light-transmitting oxide conductive material such as indium tin oxide (ITO), zinc oxide (ZnO), indium zinc oxide (IZO), gallium-doped zinc oxide (GZO), oxide containing indium oxide, gallium oxide, and zinc oxide (IGZO: indium gallium zinc oxide). Further, a mixture in which zinc oxide (ZnO) is mixed at 2% to 20% in indium tin oxide containing ITO and silicon oxide (hereinafter referred to as ITSO) or in indium oxide containing silicon oxide may be used as well for the first electrode 6004. Furthermore, a single-layer film containing one or more of titanium nitride, zirconium nitride, titanium, tungsten, nickel, platinum, chromium, silver, aluminum, and the like, a stacked layer of a titanium nitride film and a film containing aluminum as a main component, a three-layer structure of a titanium nitride film, a film containing aluminum as a main component, and a titanium nitride film, or the like can be used for the first electrode 6004. Note that in the case of using a material other than the light-transmitting oxide conductive material, the first electrode 6004 is formed to such a thickness as to transmit light (preferably, about 5 nm to 30 nm).

The second electrode 6006 is formed using such a material or to such a thickness as to reflect or shield light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron-injection layer is provided, another conductive layer such as an Al layer may be used as well.

The electroluminescent layer 6005 is formed of a single layer or a plurality of layers. When the electroluminescent layer 6005 is formed of a plurality of layers, the layers can be classified into a hole-injection layer, a hole-transport layer, a light-emitting layer, an electron-transport layer, an electron-injection layer, or the like in terms of the carrier-transport properties. In the case where the electroluminescent layer 6005 includes at least one of the hole-injection layer, the hole-transport layer, the electron-transport layer, and the electron-injection layer in addition to the light-emitting layer, the hole-injection layer, the hole-transport layer, the light-emitting layer, the electron-transport layer, and the electron-injection layer are sequentially stacked over the first electrode 6004. Note that the interface between the layers is not necessarily clear, and there might be the case where materials forming the layers are partially mixed and the interface between the layers is unclear. Each layer can be formed of an organic-based material or an inorganic-based material. As the organic-based material, any of a high molecular weight organic material, a medium molecular weight organic material, and a low molecular weight organic material can be used. Note that the medium molecular weight material corresponds to a low polymer in which the number of repetitions of a structural unit (the degree of polymerization) is about 2 to 20. There is no clear distinction between the hole-injection layer and the hole-transport layer, and the hole-injection layer and the hole-transport layer are the same in terms of the point that the hole-transport properties (hole mobility) is particularly important characteristics for both the hole-injection layer and the hole-transport layer. A layer being in contact with the anode is referred to as a hole-injection layer and a layer being in contact with the hole-injection layer is referred to as a hole-transport layer for convenience. The same is also true for the electron-transport layer and the electron-injection layer; a layer being in contact with the cathode is referred to as an electron-injection layer and a layer being in contact with the electron-injection layer is referred to as an electron-transport layer. In some cases, the light-emitting layer also functions as the electron-transport layer, and it is therefore referred to as a light-emitting electron-transport layer, too.

In the case of the pixel shown in FIG. 14A, light emitted from the light-emitting element 6003 can be extracted from the first electrode 6004 side as shown by a hollow arrow.

Next, a cross-sectional view of a pixel in the case where a transistor 6011 is a p-channel transistor, and light emitted from a light-emitting element 6013 is extracted from a second electrode 6016 side is shown in FIG. 14B. The transistor 6011 is covered with an insulating film 6017, and over the insulating film 6017, a bank 6018 having an opening is formed. In the opening of the bank 6018, the first electrode 6014 is partially exposed, and a first electrode 6014, an electroluminescent layer 6015, and the second electrode 6016 are sequentially stacked in the opening.

The first electrode 6014 is formed using such a material or to such a thickness as to reflect or shield light, and is formed using a material suitable for being used as an anode. For example, a single-layer film containing one or more of titanium nitride, zirconium nitride, titanium, tungsten, nickel, platinum, chromium, silver, aluminum, and the like, a stacked layer of a titanium nitride film and a film containing aluminum as a main component, a three-layer structure of a titanium nitride film, a film containing aluminum as a main component, and a titanium nitride film, or the like can be used for the first electrode 6014.

The second electrode 6016 is formed using such a material or to such a thickness as to have a light-transmitting property with respect to visible light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron-injection layer is provided, another conductive layer such as an Al layer may be used as well. Then, the second electrode 6016 is formed to such a thickness as to transmit light (preferably, about 5 nm to 30 nm). Note that another light-transmitting oxide conductive material can be used as well such as indium tin oxide (ITO), zinc oxide (ZnO), indium zinc oxide (IZO), gallium-doped zinc oxide (GZO), or the like. Furthermore, a mixture in which zinc oxide (ZnO) is mixed at 2% to 20% in ITO, ITSO, or indium oxide containing silicon oxide may be used as well. In the case of using the light-transmitting oxide conductive material, it is preferable to provide an electron-injection layer in the electroluminescent layer 6015.

The electroluminescent layer 6015 can be formed in the same manner as the electroluminescent layer 6005 shown in FIG. 14A.

In the case of the pixel illustrated in FIG. 14B, light emitted from the light-emitting element 6013 can be extracted from the second electrode 6016 side as shown by a hollow arrow.

Next, a cross-sectional view of a pixel in the case where a transistor 6021 is a p-channel transistor, and light emitted from a light-emitting element 6023 is extracted from a first electrode 6024 side and a second electrode 6026 side is shown in FIG. 14C. The transistor 6021 is covered with an insulating film 6027, and over the insulating film 6027, a bank 6028 having an opening is formed. In the opening of the bank 6028, the first electrode 6024 is partially exposed, and the first electrode 6024, an electroluminescent layer 6025, and the second electrode 6026 are sequentially stacked in the opening.

The first electrode 6024 can be formed in the same manner as the first electrode 6004 shown in FIG. 14A. The second electrode 6026 can be formed in the same manner as the second electrode 6016 shown in FIG. 14B. The electroluminescent layer 6025 can be formed in the same manner as the electroluminescent layer 6005 shown in FIG. 14A.

In the case of the pixel shown in FIG. 14C, light emitted from the light-emitting element 6023 can be extracted from both the first electrode 6024 side and the second electrode 6026 side as shown by hollow arrows.

This embodiment can be implemented in combination with any of the above embodiments as appropriate.

Embodiment 9

In this embodiment, a structure of a liquid crystal display device formed by a manufacturing method according to one embodiment of the present invention will be described.

Figure 15:
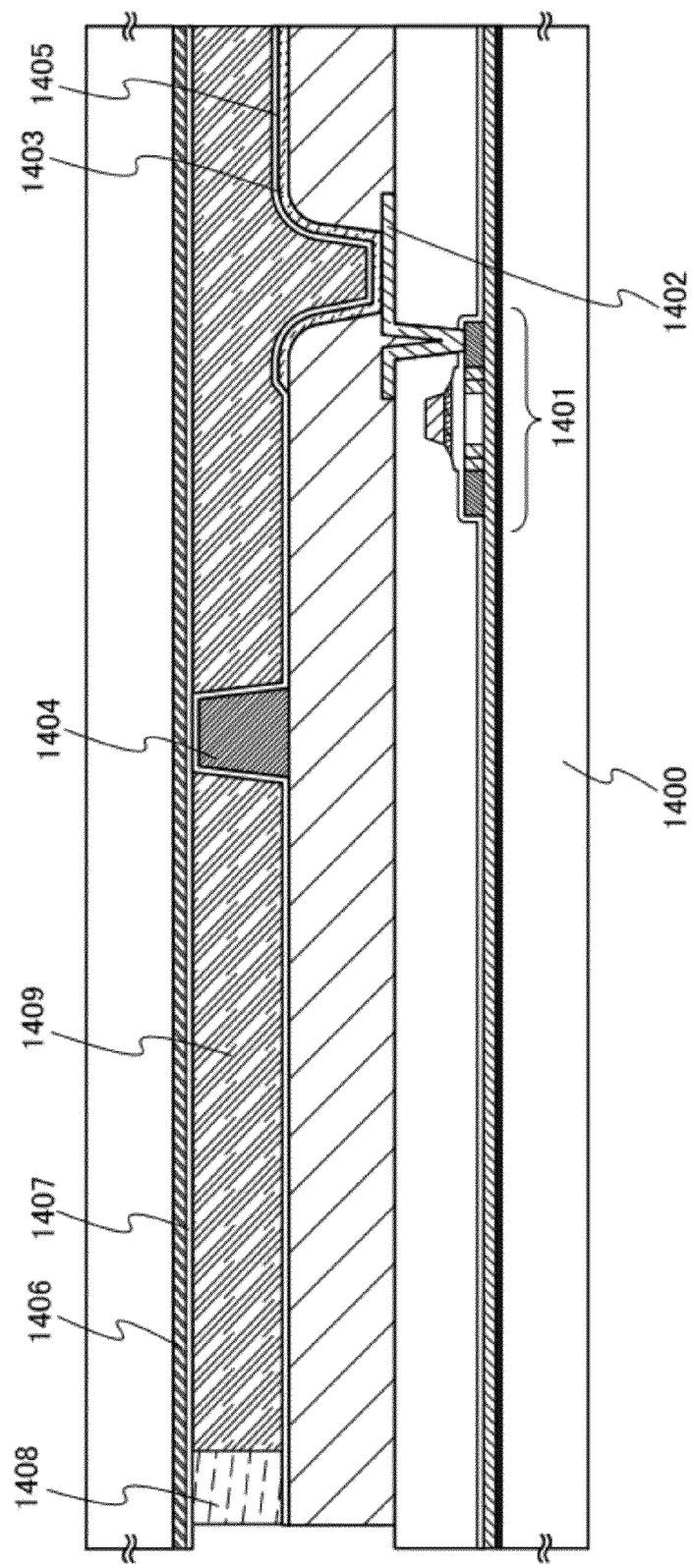
FIG. 15 is a cross-sectional view of a pixel of a liquid crystal display device formed using a manufacturing method according to one embodiment of the present invention.

FIG. 15 illustrates as an example a cross-sectional view of a liquid crystal display device of the present invention. A thin film transistor 1401 over a substrate 1400 is electrically connected to a pixel electrode 1403 through a conductive film 1402.

The cell gap of a liquid crystal element is controlled by a spacer 1404. An insulating film is etched to have a desired shape, so that the spacer 1404 can be formed. The cell gap may also be controlled with use of a filler.

An alignment film 1405 is formed over the pixel electrode 1403. The alignment film 1405 can be formed by subjecting an insulating film to rubbing treatment, for example. Further, a counter electrode 1406 is provided in a position opposed to the pixel electrode 1403, and an alignment film 1407 is formed on the side of the counter electrode 1406 which is close to the pixel electrode 1403. Furthermore, a liquid crystal 1409 is provided in a region which is surrounded by a sealant 1408 between the pixel electrode 1403 and the counter electrode 1406. Note that filler may be mixed in the sealant 1408.

The pixel electrode 1403 and the counter electrode 1406 can be formed using a transparent conductive material such as indium tin oxide containing silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1403 and the counter electrode 1406. However, the present invention is not limited to this structure. The liquid crystal display device according to one embodiment of the present invention may be a semi-transmissive type liquid crystal display device or a reflective type liquid crystal display device.

The liquid crystal display device illustrated in FIG. 15 may be provided with a color filter, a shielding film for preventing disclination (a black matrix), or the like.

Although a liquid crystal display device of a twisted nematic (TN) mode is described in this embodiment, a thin film transistor of the present invention can be used for other liquid crystal display devices of a vertical alignment (VA) mode, an optically compensated birefringence (OCB) mode, an in-plane-switching (IPS) mode, and the like.

In the liquid crystal display device according to one embodiment of the present invention, a highly reliable thin film transistor with high mobility and on-current is used; therefore, the liquid crystal display device according to one embodiment of the present invention has high contrast and high visibility.

This embodiment can be implemented in combination with any of the other embodiments as appropriate.

Example 1

With use of a manufacturing method according to one embodiment of the present invention, a semiconductor device whose variation in characteristics is reduced and which includes a semiconductor element with favorable characteristics such as high on-current and high withstand voltage can be formed. In addition, miniaturization of a semiconductor element can be realized. Therefore, an electronic device using the above semiconductor device can be provided with applications with higher performance. A semiconductor device formed by a manufacturing method according to one embodiment of the present invention can be used for display devices, laptops, or image reproducing devices provided with recording media (typically, devices which reproduce the content of recording media such as digital versatile discs (DVDs) and have displays for displaying the reproduced images). Examples of electronic devices that can use a semiconductor device formed by a manufacturing method according to one embodiment of the present invention include mobile phones, portable game consoles, personal information terminals, e-book readers, cameras such as video cameras or digital still cameras, display goggles (head-mounted displays), navigation systems, audio systems (car audio systems, digital audio players, or the like), copying machines, facsimiles, printers, versatile printers, automated teller machines (ATMs), and vending machines. Specific examples of these electronic devices are shown in FIGS. 16A to 16E.

Figure 16A:
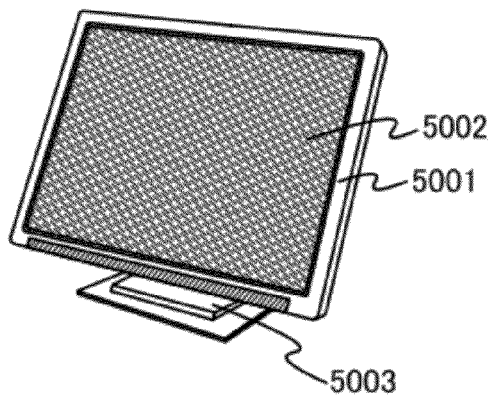
FIGS. 16A to 16E are diagrams each illustrating an electronic device including a semiconductor device.

FIG. 16A illustrates a display device including a housing 5001, a display portion 5002, a supporting base 5003, and the like. A semiconductor device formed by a manufacturing method according to one embodiment of the present invention can be used for the display portion 5002, a signal processing circuit, or the like. The use of a semiconductor device formed by a manufacturing method according to one embodiment of the present invention for the display portion 5002, a signal processing circuit, or the like can provide a display device with higher-performance applications. Note that a display device includes all display devices for displaying information, such as display devices for personal computers, for receiving television broadcast, and for displaying advertisement, in its category.

Figure 16B:
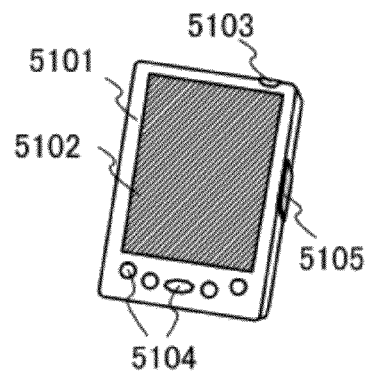

FIG. 16B illustrates a portable information terminal including a housing 5101, a display portion 5102, a switch 5103, operation keys 5104, an infrared rays port 5105, and the like. A semiconductor device formed by a manufacturing method according to one embodiment of the present invention can be used for the display portion 5102, a signal processing circuit, or the like. The use of a semiconductor device formed by a manufacturing method according to one embodiment of the present invention for the display portion 5102, the signal processing circuit, or the like can provide a portable information terminal with higher-performance applications.

Figure 16C:
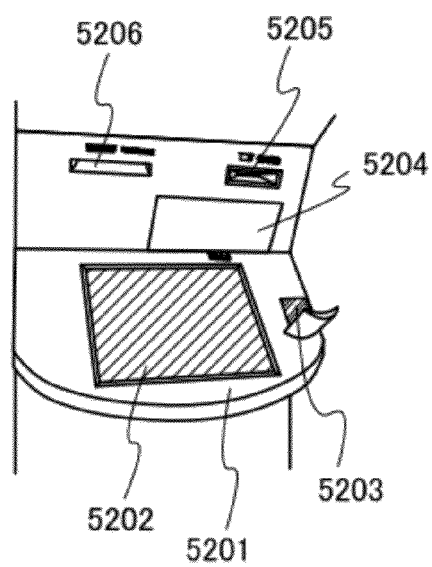

FIG. 16C illustrates an automated teller machine including a housing 5201, a display portion 5202, a coin slot 5203, a bill slot 5204, a card slot 5205, a bankbook slot 5206, and the like. A semiconductor device formed by a manufacturing method according to one embodiment of the present invention can be used for the display portion 5202, a signal processing circuit, or the like. The use of a semiconductor device formed by a manufacturing method according to one embodiment of the present invention for the display portion 5202, the signal processing circuit, or the like can provide an automated teller machine with higher-performance applications.

Figure 16D:
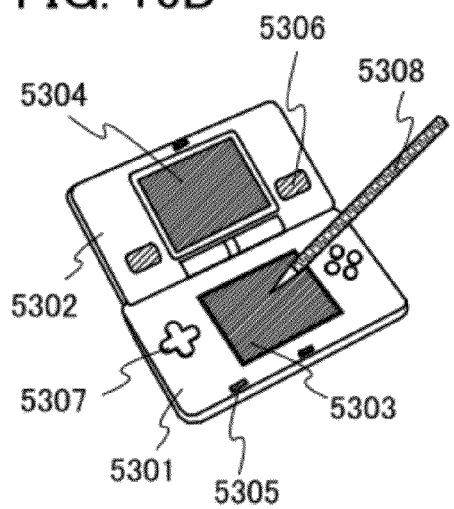

FIG. 16D illustrates a portable game machine including a housing 5301, a housing 5302, a display portion 5303, a display portion 5304, a microphone 5305, speakers 5306, operation keys 5307, a stylus 5308, and the like. A semiconductor device formed by a manufacturing method according to one embodiment of the present invention can be used for the display portion 5303, the display portion 5304, a signal processing circuit, or the like. The use of a semiconductor device formed by a manufacturing method according to one embodiment of the present invention for the display portion 5303, the display portion 5304, the signal processing circuit, or the like can provide a portable game machine with higher-performance applications. Note that although the portable game machine illustrated in FIG. 16D includes two display portions 5303 and 5304, the number of display portions included in the portable game machine is not limited to two.

Figure 16E:
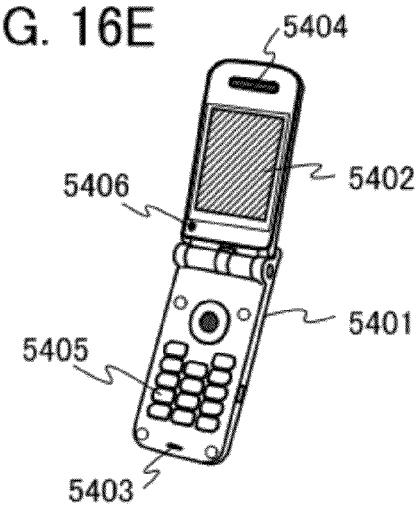

FIG. 16E illustrates a mobile phone which includes a housing 5401, a display portion 5402, an audio input portion 5403, an audio output portion 5404, operation keys 5405, a light-receiving portion 5406, and the like. Light received in the light-receiving portion 5406 is converted into electrical signals, whereby external images can be loaded. A semiconductor device formed by a manufacturing method according to one embodiment of the present invention can be used for the display portion 5402, a signal processing circuit, or the like. The use of a semiconductor device formed by a manufacturing method according to one embodiment of the present invention for the display portion 5402, the signal processing circuit, or the like can provide a mobile phone with higher-performance applications.

This example can be implemented in combination with any of the above embodiments as appropriate.

This application is based on Japanese Patent Application serial no. 2009-202286 filed with Japan Patent Office on Sep. 2, 2009, the entire contents of which are hereby incorporated by reference.

What is claimed is:

1. A method for manufacturing an SOI substrate, comprising the steps of:
   attaching a single crystal semiconductor substrate and a base substrate to each other with an insulating film sandwiched therebetween;
   splitting the single crystal semiconductor substrate to form a single crystal semiconductor film over the base substrate with the insulating film sandwiched therebetween;
   removing an oxide film which is formed over the single crystal semiconductor film;
   irradiating the single crystal semiconductor film with a first laser light; and
   irradiating the single crystal semiconductor film with a second laser light,
   wherein a number of shots of the second laser light that is received by a point in the single crystal semiconductor film is smaller than a number of shots of the first laser light that is received by the point in the single crystal semiconductor film.

2. A method for manufacturing an SOI substrate, comprising the steps of:
   attaching a single crystal semiconductor substrate and a base substrate to each other with an insulating film sandwiched therebetween;
   splitting the single crystal semiconductor substrate to form a single crystal semiconductor film over the base substrate with the insulating film sandwiched therebetween;
   removing an oxide film formed over the single crystal semiconductor film;
   irradiating the single crystal semiconductor film with a first laser light so that a number of shots of the first laser light that is received by a point in the single crystal semiconductor film is greater than or equal to 10 and less than or equal to 100; and
   irradiating the single crystal semiconductor film with a second laser light so that a number of shots of the second laser light that is received by the point in the single crystal semiconductor film is greater than 0 and less than or equal to 2.

3. A method for manufacturing an SOI substrate, comprising the steps of:
attaching a single crystal semiconductor substrate and a base substrate to each other with an insulating film sandwiched therebetween;
splitting the single crystal semiconductor substrate to form a single crystal semiconductor film over the base substrate with the insulating film sandwiched therebetween;
removing an oxide film formed over the single crystal semiconductor film;
irradiating the single crystal semiconductor film with a first laser light; and
irradiating the single crystal semiconductor film with a second laser light,
wherein a scanning speed of irradiating the single crystal semiconductor film with the second laser light is faster than a scanning speed of irradiating the single crystal semiconductor film with the first laser light.

4. The method for manufacturing an SOI substrate according to claim 1,
wherein an energy density of the first laser light is an energy density that the single crystal semiconductor film is partially melted.

5. The method for manufacturing an SOI substrate according to claim 1,
wherein an energy density of the second laser light is an energy density that the single crystal semiconductor film is partially melted.

6. The method for manufacturing an SOI substrate according to claim 1,
wherein a recrystallization of the single crystal semiconductor film with the first laser light proceeds in a vertical direction.

7. The method for manufacturing an SOI substrate according to claim 1,
further comprising the step of removing an oxide film formed over the single crystal semiconductor film after the step of irradiating the single crystal semiconductor film with the first laser light.

8. The method for manufacturing an SOI substrate according to claim 1,
wherein the step of irradiating the single crystal semiconductor film with the first laser light is performed in an inert atmosphere or a reduced-pressure atmosphere.

9. The method for manufacturing an SOI substrate according to claim 1,
wherein the step of irradiating the single crystal semiconductor film with the first laser light is performed in an inert atmosphere that can be achieved by spraying an inert gas.

10. The method for manufacturing an SOI substrate according to claim 1,
further comprising the step of performing heat treatment at greater than or equal to 500° C. and less than or equal to 650° C. after the step of irradiating the single crystal semiconductor film with the second laser light.

11. The method for manufacturing an SOI substrate according to claim 3,
wherein an energy density of the first laser light is an energy density that the single crystal semiconductor film is partially melted.

12. The method for manufacturing an SOI substrate according to claim 3,
wherein an energy density of the second laser light is an energy density that the single crystal semiconductor film is partially melted.

13. The method for manufacturing an SOI substrate according to claim 3,
wherein a recrystallization of the single crystal semiconductor film with the first laser light proceeds in a vertical direction.

14. The method for manufacturing an SOI substrate according to claim 3,
further comprising the step of removing an oxide film formed over the single crystal semiconductor film after the step of irradiating the single crystal semiconductor film with the first laser light.

15. The method for manufacturing an SOI substrate according to claim 3,
wherein the step of irradiating the single crystal semiconductor film with the first laser light is performed in an inert atmosphere or a reduced-pressure atmosphere.

16. The method for manufacturing an SOI substrate according to claim 3,
wherein the step of irradiating the single crystal semiconductor film with the first laser light is performed in an inert atmosphere that can be achieved by spraying an inert gas.

17. The method for manufacturing an SOI substrate according to claim 3,
further comprising the step of performing heat treatment at greater than or equal to 500° C. and less than or equal to 650° C. after the step of irradiating the single crystal semiconductor film with the second laser light.

18. A method for manufacturing a semiconductor device, comprising the steps of:
attaching a single crystal semiconductor substrate and a base substrate to each other with an insulating film sandwiched therebetween;
splitting the single crystal semiconductor substrate to form a single crystal semiconductor film over the base substrate with the insulating film sandwiched therebetween;
removing an oxide film formed over the single crystal semiconductor film;
irradiating the single crystal semiconductor film with a first laser light;
irradiating the single crystal semiconductor film with a second laser light; and
processing the single crystal semiconductor film into a patterned shape,
wherein a number of shots of the second laser light that is received by a point in the single crystal semiconductor film is smaller than a number of shots of the first laser light that is received by the point in the single crystal semiconductor film.

19. A method for manufacturing a semiconductor device, comprising the steps of:
attaching a single crystal semiconductor substrate and a base substrate to each other with an insulating film sandwiched therebetween;
splitting the single crystal semiconductor substrate to form a single crystal semiconductor film over the base substrate with the insulating film sandwiched therebetween;
removing an oxide film formed over the single crystal semiconductor film;
irradiating the single crystal semiconductor film with a first laser light so that a number of shots of the first laser light that is received by a point in the single crystal semiconductor film is greater than or equal to 10 and less than or equal to 100;

irradiating the single crystal semiconductor film with a second laser light so that a number of shots of the second laser light that is received by the point in the single crystal semiconductor film is greater than 0 and less than or equal to 2; and processing the single crystal semiconductor film into a patterned shape.

20. A method for manufacturing a semiconductor device, comprising the steps of:

attaching a single crystal semiconductor substrate and a base substrate to each other with an insulating film sandwiched therebetween;

splitting the single crystal semiconductor substrate to form a single crystal semiconductor film over the base substrate with the insulating film sandwiched therebetween;

removing an oxide film formed over the single crystal semiconductor film;

irradiating the single crystal semiconductor film with a first laser light;

irradiating the single crystal semiconductor film with a second laser light; and processing the single crystal semiconductor film into a patterned shape, wherein a scanning speed of irradiating the single crystal semiconductor film with the second laser light is faster than a scanning speed of irradiating the single crystal semiconductor film with the first laser light.

21. The method for manufacturing a semiconductor device according to claim 18,
wherein an energy density of the first laser light is an energy density that the single crystal semiconductor film is partially melted.

22. The method for manufacturing a semiconductor device according to claim 18,
wherein an energy density of the second laser light is an energy density that the single crystal semiconductor film is partially melted.

23. The method for manufacturing a semiconductor device according to claim 18,
wherein a recrystallization of the single crystal semiconductor film with the first laser light proceeds in a vertical direction.

24. The method for manufacturing a semiconductor device according to claim 18,
further comprising the step of removing an oxide film formed over the single crystal semiconductor film after the step of irradiating the single crystal semiconductor film with the first laser light.

25. The method for manufacturing a semiconductor device according to claim 18,
wherein the step of irradiating the single crystal semiconductor film with the first laser light is performed in an inert atmosphere or a reduced-pressure atmosphere.

26. The method for manufacturing a semiconductor device according to claim 18,
wherein the step of irradiating the single crystal semiconductor film with the first laser light is performed in an inert atmosphere that can be achieved by spraying an inert gas.

27. The method for manufacturing a semiconductor device according to claim 18,
further comprising the step of performing heat treatment at greater than or equal to 500° C. and less than or equal to 650° C. after the step of irradiating the single crystal semiconductor film with the second laser light.

28. The method for manufacturing a semiconductor device according to claim 20,
wherein an energy density of the first laser light is an energy density that the single crystal semiconductor film is partially melted.

29. The method for manufacturing a semiconductor device according to claim 20,
wherein an energy density of the second laser light is such an energy density that the single crystal semiconductor film is partially melted.

30. The method for manufacturing a semiconductor device according to claim 20,
wherein a recrystallization of the single crystal semiconductor film with the first laser light proceeds in a vertical direction.

31. The method for manufacturing a semiconductor device according to claim 20,
further comprising the step of removing an oxide film formed over the single crystal semiconductor film after the step of irradiating the single crystal semiconductor film with the first laser light.

32. The method for manufacturing a semiconductor device according to claim 20,
wherein the step of irradiating the single crystal semiconductor film with the first laser light is performed in an inert atmosphere or a reduced-pressure atmosphere.

33. The method for manufacturing a semiconductor device according to claim 20,
wherein the step of irradiating the single crystal semiconductor film with the first laser light is performed in an inert atmosphere that can be achieved by spraying an inert gas.

34. The method for manufacturing a semiconductor device according to claim 20,
further comprising the step of performing heat treatment at greater than or equal to 500° C. and less than or equal to 650° C. after the step of irradiating the single crystal semiconductor film with the second laser light.

* * * * *